US010127989B2

United States Patent
Kurafuji

(10) Patent No.: US 10,127,989 B2
(45) Date of Patent: *Nov. 13, 2018

(54) SEMICONDUCTOR DEVICE

(71) Applicant: RENESAS ELECTRONICS CORPORATION, Tokyo (JP)

(72) Inventor: Takashi Kurafuji, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/956,401

(22) Filed: Apr. 18, 2018

(65) Prior Publication Data

US 2018/0240524 A1    Aug. 23, 2018

Related U.S. Application Data

(63) Continuation of application No. 15/466,326, filed on Mar. 22, 2017, now Pat. No. 9,978,455.

(30) Foreign Application Priority Data

Mar. 24, 2016    (JP) ................................. 2016-060092

(51) Int. Cl.
  *G11C 16/26*    (2006.01)
  *G11C 16/16*    (2006.01)
  (Continued)

(52) U.S. Cl.
  CPC ............ *G11C 16/26* (2013.01); *G06F 3/0623* (2013.01); *G06F 3/0632* (2013.01);
  (Continued)

(58) Field of Classification Search
  CPC ......... G11C 16/26; G11C 16/10; G11C 16/20; G11C 16/16; G11C 16/3459;
  (Continued)

(56) References Cited

U.S. PATENT DOCUMENTS 7,646,642 B2    1/2010  Fujito et al.
9,978,455 B2 *  5/2018  Kurafuji ................ G11C 16/26
(Continued)

FOREIGN PATENT DOCUMENTS

JP    2003-044457 A    2/2003

OTHER PUBLICATIONS

Non-Final Office Action issued in related parent U.S. Appl. No. 15/466,326, dated Oct. 10, 2017.
(Continued)

*Primary Examiner* — Tri Hoang
(74) *Attorney, Agent, or Firm* — McDermott Will & Emery LLP

(57) ABSTRACT

An object of the present disclosure is to provide a semiconductor having high security. A semiconductor device includes: a memory region having a plurality of memory cells capable of storing data; a read circuit capable of switching a reference current reading method of reading data by comparing current flowing a memory cell to be read in the memory region with a reference current, and a complementary reading method of reading data by comparing currents flowing in first and second memory cells in which complementary data to be read in the memory region is stored; a register setting a security state; a mode controller setting a mode; and a control circuit controlling the reference current reading method and the complementary reading method of reading the data in the read circuit on the basis of a signal of setting a mode from the mode controller and a value of the register.

12 Claims, 16 Drawing Sheets

(51) Int. Cl.
  *G11C 16/34* (2006.01)
  *G11C 16/10* (2006.01)
  *G11C 16/20* (2006.01)
  *G06F 3/06* (2006.01)

(52) U.S. Cl.
  CPC .......... *G06F 3/0634* (2013.01); *G06F 3/0652* (2013.01); *G06F 3/0655* (2013.01); *G06F 3/0679* (2013.01); *G11C 16/10* (2013.01); *G11C 16/16* (2013.01); *G11C 16/20* (2013.01); *G11C 16/3459* (2013.01)

(58) Field of Classification Search
  CPC .... G06F 3/0623; G06F 3/0632; G06F 3/0634; G06F 3/0652; G06F 3/0655; G06F 3/0679
  See application file for complete search history.

(56) References Cited

U.S. PATENT DOCUMENTS

| | | |
|---|---|---|
| 2013/0235678 A1 | 9/2013 | McCollum et al. |
| 2016/0064095 A1 | 3/2016 | Kato et al. |
| 2016/0210070 A1 | 7/2016 | Kurafuji et al. |

OTHER PUBLICATIONS

Notice of Allowance issued in related parent U.S. Appl. No. 15/466,326, dated Jan. 23, 2018.

\* cited by examiner

|  | BL | CG | MG | SL | WELL | |
|---|---|---|---|---|---|---|
| READ | 1.5V | 1.5V | 0V | 0V | 0V | |
| INCREASE Vth | 0V | 1.5V | 10V | 6V | 0V | (EVERY BIT) |
| DECREASE Vth | Hi-Z | 0V | -10V | 6V | 0V | (IN A LUMP) |

|  | BL | WL | SL | WELL |  |
|---|---|---|---|---|---|
| READ | 1.5V | 1.5V | 0V | 0V |  |
| INCREASE Vth | 6V | 10V | 0V | 0V | (EVERY BIT) |
| DECREASE Vth | 10V | −10V | 10V | 10V | (IN A LUMP) |

|  | BL | WL | SL | WELL |  |
|---|---|---|---|---|---|
| READ | 1.5V | 1.5V | 0V | 0V |  |
| INCREASE Vth | −10V | 10V | −10V | −10V | (IN A LUMP) |
| DECREASE Vth | 10V | −10V | 0V | 0V | (EVERY BIT) |

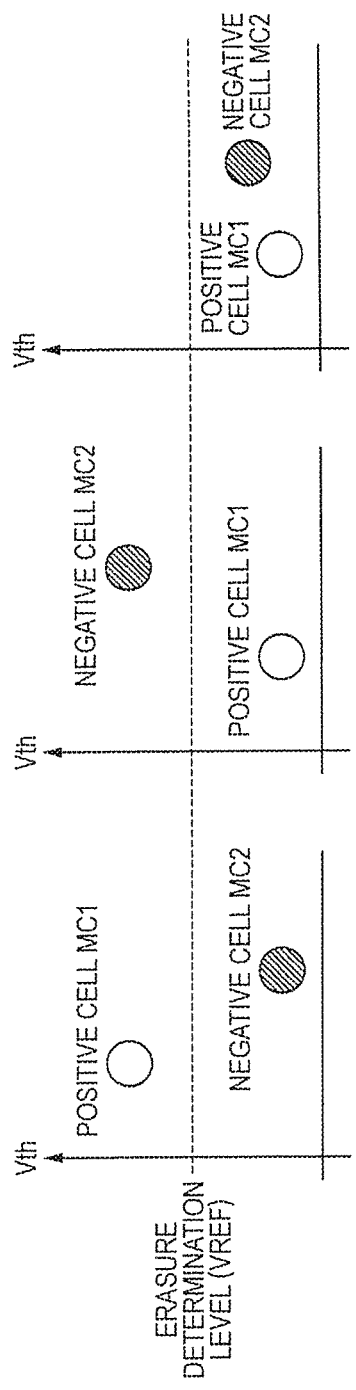

FIG. 11

| STATE OF MICROCONTROLLER | METHOD AT THE TIME OF READING FLASH MEMORY | DATA READ FROM FLASH MEMORY | |
|---|---|---|---|
| | | ERASED REGION | WRITTEN REGION |
| BOOT MODE AND READ INHIBITION FLAG ARE IN INHIBITION STATE | REFERENCE CURRENT READING METHOD | VALUE INDICATIVE OF ERASURE | INDETERMINATE |
| EXCEPT FOR THE ABOVE | COMPLEMENTARY READING METHOD | INDETERMINATE (THERE IS THE CASE OF DATA BEFORE ERASURE) | WRITTEN VALUE |

FIG. 16

| KIND OF CPU | REGION TO BE ERASED | ERASURE MODE |
|---|---|---|
| CPU | NORMAL USER REGION | HIGH-SPEED INITIALIZE MODE |
| | HIGH-SECURITY USER REGION | HIGH-SPEED INITIALIZE MODE (ERASURE STOP) |
| SECURE CPU | NORMAL USER REGION | HIGH-SECURITY INITIALIZE |
| | HIGH-SECURITY USER REGION | HIGH-SECURITY INITIALIZE |

SEMICONDUCTOR DEVICE

CROSS-REFERENCE TO RELATED APPLICATIONS

This application is a Continuation of U.S. patent application Ser. No. 15/466,326 filed on Mar. 22, 2017, which claims the benefit of Japanese Patent Application No. 2016-060092 filed on Mar. 24, 2016 including the specification, drawings and abstract are incorporated herein by reference in their entirety.

BACKGROUND

The present disclosure relates to a semiconductor device and, for example, relates to a semiconductor device such as a microcomputer having a nonvolatile memory.

In a microcomputer having a central processing unit, a flash memory, and the like, a program developed by a set maker or the like using the microcomputer, parameter data, and the like is written in a flash memory and used.

To such stored information, there is a fear of an unauthorized access. For example, when such a microcomputer is coupled to an external writing device (also called a programmer) and has an operation mode in which data can be erased/written from/to a storage region in a flash memory, by setting the operation mode, a program stored in the storage region can be relatively easily read and taken to the outside.

That is, the microcomputer is set as a single flash memory in appearance and set in a state where it can operate according to a read access command from the outside.

Therefore, a technique for security protection to prevent an authorized access to such stored information is necessary.

Japanese Unexamined Patent Application Publication No. 2003-44457 proposes a method which permits data writing after execution of erasure of all of data to satisfy both convenience of data rewriting and data leakage. Although security is temporarily cancelled to permit data writing, by erasing all of data in advance, protected data is prevented from being leaked.

Related Art Literature

Patent Literature

Patent Literature 1: Japanese Unexamined Patent Application Publication No. 2003-44457

On the other hand, a flash memory of a complementary flash memory has a characteristic that data after erasure becomes an indeterminate value, and data before erasure can be read.

Therefore, an object of the present disclosure is to provide a semiconductor device having high security from the viewpoint of preventing data leakage.

The other objects and novel features will become apparent from the description of the specification and appended drawings.

SUMMARY

According to an embodiment, a semiconductor device includes: a memory region having a plurality of memory cells capable of storing data; a read circuit capable of switching a reference current reading method of reading data by comparing current flowing a memory cell to be read in the memory region with a reference current, and a complementary reading method of reading data by comparing currents flowing in first and second memory cells in which complementary data to be read in the memory region is stored; a register setting a security state; a mode controller setting a mode; and a control circuit controlling the reference current reading method and the complementary reading method of reading the data in the read circuit on the basis of a signal of setting a mode from the mode controller and a value of the register.

According the embodiment, the control circuit controls the reference current reading method and the complementary reading method reading the data in the read circuit on the basis of a signal of setting a mode and a of the register. In the case of switching the method to the reference current reading method, data before erasure in a region from which data is erased cannot be read. Therefore, security can be increased.

BRIEF DESCRIPTION OF THE DRAWINGS

FIGS. 4A to 4C are diagrams for explaining cell data in the case of a complementary reading method.

FIG. 11 is a diagram illustrating data in the case of reading a user region 221.

FIG. 16 is a diagram explaining an erasing method based on the kind of a CPU based on the fourth embodiment.

DETAILED DESCRIPTION

Figure 1:
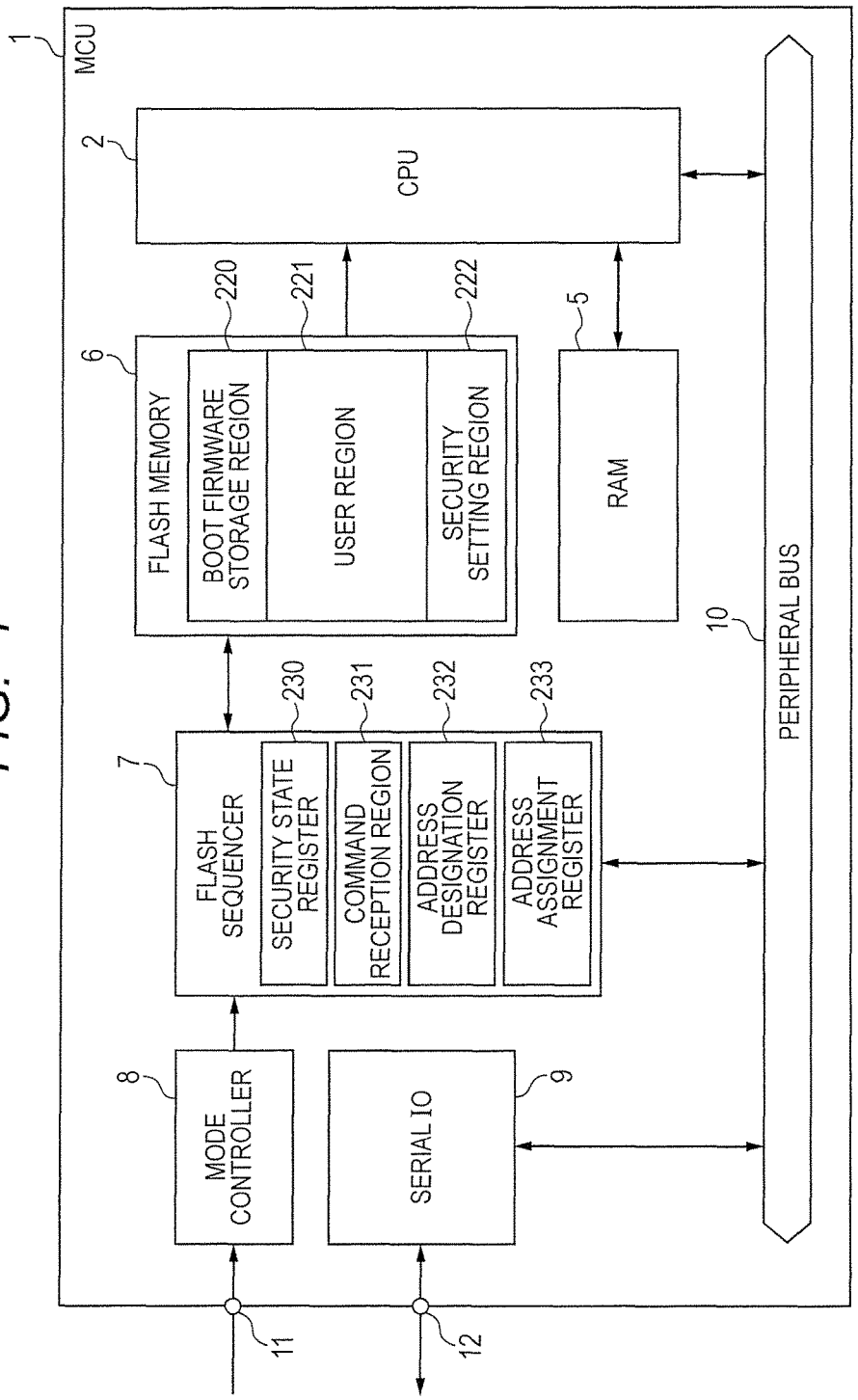
FIG. 1 is a block diagram illustrating the configuration of a semiconductor device based on a first embodiment.

Embodiments will be described in detail with reference to the drawings. In the drawings, the same reference numeral is designated to the same or equivalent part and its description will not be repeated.

First Embodiment

A. Configuration of Microcomputer a1. General Configuration

FIG. 1 is a block diagram illustrating the configuration of a semiconductor device based on a first embodiment.

Referring to FIG. 1, in the embodiment, the configuration of a microcomputer (MCU) 1 is illustrated as an example of a semiconductor device.

The microcomputer 1 is formed on a single semiconductor chip of single-crystal silicon or the like by using, for example a CMOS (Complementary Metal Oxide Semiconductor) integrated circuit manufacturing technique.

The microcomputer 1 has a central processing unit (CPU) 2, a random access memory (RAM) 5, and a flash memory (FMDL) 6. The central processing unit 2 has an instruction control unit and an execution unit and executes an instruction. The flash memory 6 is provided as a nonvolatile memory storing data and a program.

The RAM 5 is used as a work region of the central processing unit 2. For example, when reading from the flash memory 6 cannot be executed during writing/erasure of the flash memory 6, by copying data from the flash memory 6 to the RAM 5, the CPU 2 can continue the process. Also in the case where write data to the flash memory 6 received from a programmer has to be temporarily saved, the RAM 5 can be used.

The microcomputer 1 further has a flash sequencer (FSQC) 7, a mode controller 8, a serial IO 9, and a peripheral bus 10.

The flash sequencer 7 performs command access control on the flash memory (FMDL) 6.

In the example, the flash sequencer 7 includes a security state register 230 setting a security state, a command reception region 231, an address designation register 232, and an address assignment register 233.

The address designation register 232 is a register for designating an address in the flash memory 6 to/from which data is written/erased.

The address assignment register 233 is a register for designating an address discriminating a region in the flash memory 6. Information for designating a reading method for each region is also included.

The command reception region 231 is a region for receiving a command of writing, erasing, or the like. By transmitting a specific command to the command reception region 231 by the CPU 2, the flash sequencer 7 executes the control of the flash memory 6.

The security state register 230 stores a copy of setting information stored in a security setting region 222 in the flash memory 6.

Each of the peripheral buses 10 includes, although not limited, a data bus, an address bus, and a control bus.

To the peripheral bus 10, the flash sequencer 7, the serial IO 9, and the CPU 2 are coupled.

To the mode controller 8, a mode signal MD and a reset signal RES from the outside of the chip to a mode terminal 11 are input.

When the reset signal RES is set to the "L" level by power-on reset or hardware reset of the microcomputer 1, resetting operation is performed in the microcomputer 1 in the low-level period. After cancellation of the reset by the reset signal RES, according to the state of the mode signal MD, the operation mode of the microcomputer 1 is determined.

The CPU 2 reads a start vector of a program region according to the operation mode, fetches an instruction of the address, decodes the fetched instruction, and starts executing the instruction.

The serial IC 9 can be used as an interface with the outside and has an interface function of an address, data, and a control signal. The serial IC 9 is coupled to a programmer provided on the outside via a serial communication terminal 12 and data is transmitted/received to/from the programmer.

The CPU 2 has, although not limited, an instruction control unit decoding a fetched instruction and controlling instruction execution and an execution unit subjected to control of the instruction control unit and executing an instruction by performing arithmetic process. For example, the execution unit has a computing unit, a general register, a program counter, a status register, and the like, and the instruction control unit has an instruction register, an instruction decoder, an instruction sequence logic, and the like.

In FIG. 1, since the flash sequencer 7 as a logic circuit and the flash memory 6 of the array configuration are designed by using different CAD tools, they are illustrated as different circuit blocks for convenience. However, they can be combined as a single flash memory.

At the time of an access of data writing and initialization to the flash memory 6, the CPU 2 issues a command to the flash sequencer 7 via the peripheral bus (PBUS) 10. The command is received by the command reception region 231 in the flash sequencer 7. In response to the command, the flash sequencer 7 executes control of initialization and writing operation of the flash memory 6.

The array region in the flash memory 6 is divided according to kinds of data to be stored.

Concretely, the flash memory 6 includes a boot firmware storage region 220 storing boot firmware used by the CPU 2 in a boot mode, a user region 221 storing a user program used by the CPU 2 in a user mode, and the security setting region 222 storing data related to security of the microcomputer 1.

Generally, storing methods of a nonvolatile memory include a method of storing data of "1" or "0" in each memory cell or a pair of memory cells, and a method of storing complementary data of "1" and "0" in a pair of memory cells. In the former case, by comparing current flowing in a memory cell and reference current, data of the memory cell is read (hereinbelow, also called a reference current reading method). In the latter case, by comparing currents flowing in memory cells forming a pair, data of the memory cell pair is read (hereinbelow, also called a complementary reading method).

In the reference current reading method, reading speed is faster than that in the complementary reading method. However, the memory cell has to be sufficiently erased, so that it has a drawback that the number of rewriting times is smaller than that in the complementary reading method.

Consequently, the reference current reading method is often used for a region which is not frequently rewritten.

On the other hand, in the case of the complementary reading method, read current can be made smaller and the number of rewriting times can be made later as compared with those in the reference current reading method. Consequently, the complementary reading method is used for a region which is frequently rewritten.

A data reading method is changeable according to the type of an array area in the flash memory 6 in the embodiment.

As an example, the case where the boot firmware storage region 220 and the security setting region 222 are set in the reference current reading method in which rewriting is not performed frequently, and the user region 221 is set in the complementary reading method in which rewriting is performed frequently will be described.

Information of addresses of the boot firmware storage region 220, the user region 221, and the security setting region 222 is stored in the address assignment register 233.

a2. Configuration and Operation of Memory Cell

Figures 2A, 2B:
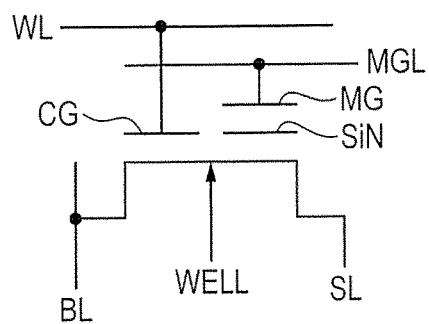
FIGS. 2A and 2B are diagrams for explaining the configuration and operation of a memory cell.

FIGS. 2A and 2B are for explaining the configuration and operation of a memory cell.

FIGS. 2A and 2B illustrate the case of a split-gate-type flash memory element as an example.

Referring to FIG. 2A, the split-gate-type flash memory element includes a control gate CG and a memory gate MG disposed over a channel formation region between a source region and a drain region via a gate insulating film. Between the memory gate MG and the gate insulating film, a charge trap region (SiN) of silicon nitride or the like is disposed. The control gate CG is coupled to a word line WL, and the memory gate MG is coupled to a memory gate selection line MGL. The drain region (or source region) on the control gate CG side is coupled to a bit line BL, and the source region (or drain region) on the memory gate MG side is coupled to a source line SL.

FIG. 2B illustrates an example of voltage setting in the bit line BL, the control gate CG, the memory gate MG, the source line SL, and a well region (WELL) at the time of reading and writing/erasing of the split-gate-type flash memory element.

Concretely, to decrease a threshold voltage Vth of the memory cell, for example, setting is made that BL=1.5V, CG=0.0V, MG=−10V, SL=6V, and WELL=0V. By the setting, holes out of electrons and holes generated by high electric field between the well region (WELL) and the memory gate MG are injected from the well region (WELL) to the charge trap region (SiN). The process is executed on a basis of a plurality of memory cells sharing the memory gate.

To increase the threshold voltage Vth, for example, setting is made that BL=0V, CG=1.5V, MG=10V, SL=6, and WELL=0V. In this case, write current flows from the source line SL to the bit line, so that hot electrons are generated in a border part between the control gate and the memory gate, and the generated hot electrons are injected to the charge trap region (SiN). Since injection of electrons is determined by whether current is passed to the bit line or not, the process is controlled on the bit unit basis.

At the time of reading, for example, setting is made that BL=1.5V, CG=1.5V, MG=0V, SL=0V, and WELL=0V. When the threshold voltage Vth of the memory cell is low, the resistance of the memory cell decreases (on state). When the threshold voltage Vth is high, the resistance of the memory cell increases (off state).

In the embodiment, the case of the split-gate-type flash memory element will be described. Particularly, the invention is not limited to the element but can be similarly applied to other memory elements. For example, a stacked-gate-type flash memory cell can be also used.

Figures 3A, 3B, 3C:
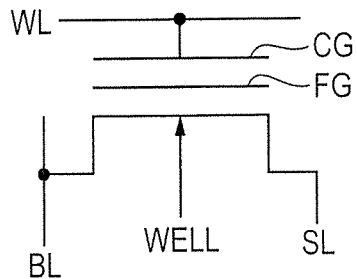
FIGS. 3A to 3C are other diagrams for explaining the configuration and operation of a memory cell.

FIGS. 3A to 3C are other diagrams for explaining the configuration and operation of a memory cell.

A stacked-gate-type flash memory element illustrated in FIG. 3A is configured by stacking the floating gate FG and the control gate CG over the channel formation region between the source region and the drain region via the gate insulating film. The control gate CG is coupled to the word line WL. The drain region is coupled to the bit line BL, and the source region is coupled to the source line SL.

FIGS. 3B and 3C illustrate an example of voltage setting of the bit line BL, the word line WL, the source line SL, and the well region (WELL) at the time of reading and writing/erasing of the stacked-gate-type flash memory element. FIG. 3B illustrates a voltage setting example in the case of increasing the threshold voltage Vth by a hot carrier writing method and decreasing the threshold voltage Vth by releasing electrons to the well region WELL. FIG. 3C illustrates a voltage setting example in the case of increasing the threshold voltage Vth by an FN tunnel writing method and decreasing the threshold voltage Vth by releasing electrons to the bit line BL.

The control gate CG is also called a control electrode, an impurity region coupled to the bit line BL is also called a first main electrode, and an impurity region coupled to the source line SL is also called a second main electrode.

a3. Reference Current Reading Method and Complementary Reading Method

FIGS. 4A to 4C are diagrams for explaining cell data in the case of a complementary reading method.

Referring to FIGS. 4A to 4C, in the complementary reading method, predetermined two rewritable nonvolatile memory cells MC1 and MC2 in a memory array are used as twin cells of one bit. In the specification, the memory cell MC1 is called a positive cell, and the memory cell MC2 is called a negative cell. Each of the memory cells MC1 and MC2 can hold cell data "1" (low threshold voltage state: state in which the threshold voltage is less than an erasure verification level) or cell data "0" (high threshold voltage state: state in which the threshold voltage is equal to or higher than the erasure verification level).

Information storage by the twin cells in the complementary reading method is performed by storing complementary data in the nonvolatile memory cells MC1 and MC2 configuring the twin cells. Specifically, as illustrated in FIG. 4A, the data "0" is a state in which the positive cell MC1 holds the cell data "0" and the negative cell MC2 holds the cell data "1". As illustrated in FIG. 4B, the data "1" is a state in which the positive cell MC1 holds the cell data "1" and the negative cell MC2 holds the cell data "0". As illustrated in FIG. 4C, a state in which both the positive cell MC1 and the negative cell MC2 of the twin cells hold the cell data "1" is an initialize state, and the data of the twin cells is indefinite.

Figures 5A, 5B:
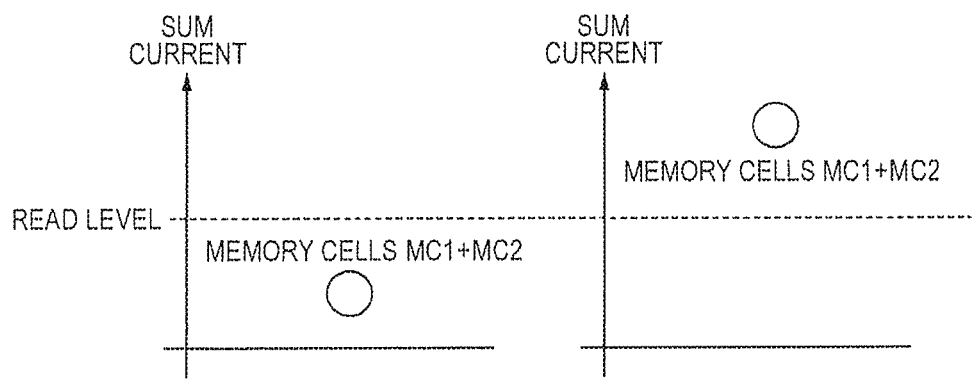
FIGS. 5A and 5B are diagrams for explaining cell data in the case of a reference current reading method.

FIGS. 5A and 5B are diagrams for explaining cell data in the case of the reference current reading method.

Referring to FIGS. 5A and 5B, in the reference current reading method in the embodiment, the predetermined two rewritable nonvolatile memory cells MC1 and MC2 in the memory array are used as twin cells of one bit.

Information storage by the twin cells in the reference reading method is performed by storing the same data in the nonvolatile memory cells MC1 and MC2 configuring the twin cells. Therefore, in the reference current reading method, the positive and negative cells in twin cells are not discriminated. As an example, the data "0" is a state in which both the memory cells MC1 and MC2 hold the cell data "0" (high threshold voltage state). The data "1" is a state in which the memory cells MC1 and MC2 hold the cell data "1" (low threshold voltage state).

As illustrated in FIG. 5A, in the state where the memory cells MC1 and MC2 hold the cell data "0" (high threshold voltage state), the sum current flowing in the memory cells MC1 and MC2 becomes lower as compared with a read level (reference current). In this state, the data "0" is read.

As illustrated in FIG. 5B, in the state where the memory cells MC1 and MC2 hold the cell data "1" (low threshold voltage state), the sum current flowing in the memory cells MC1 and MC2 becomes higher as compared with a read level (reference current). In this state, the data "1" is read.

a4. Configuration of Flash Memory

Figure 6:
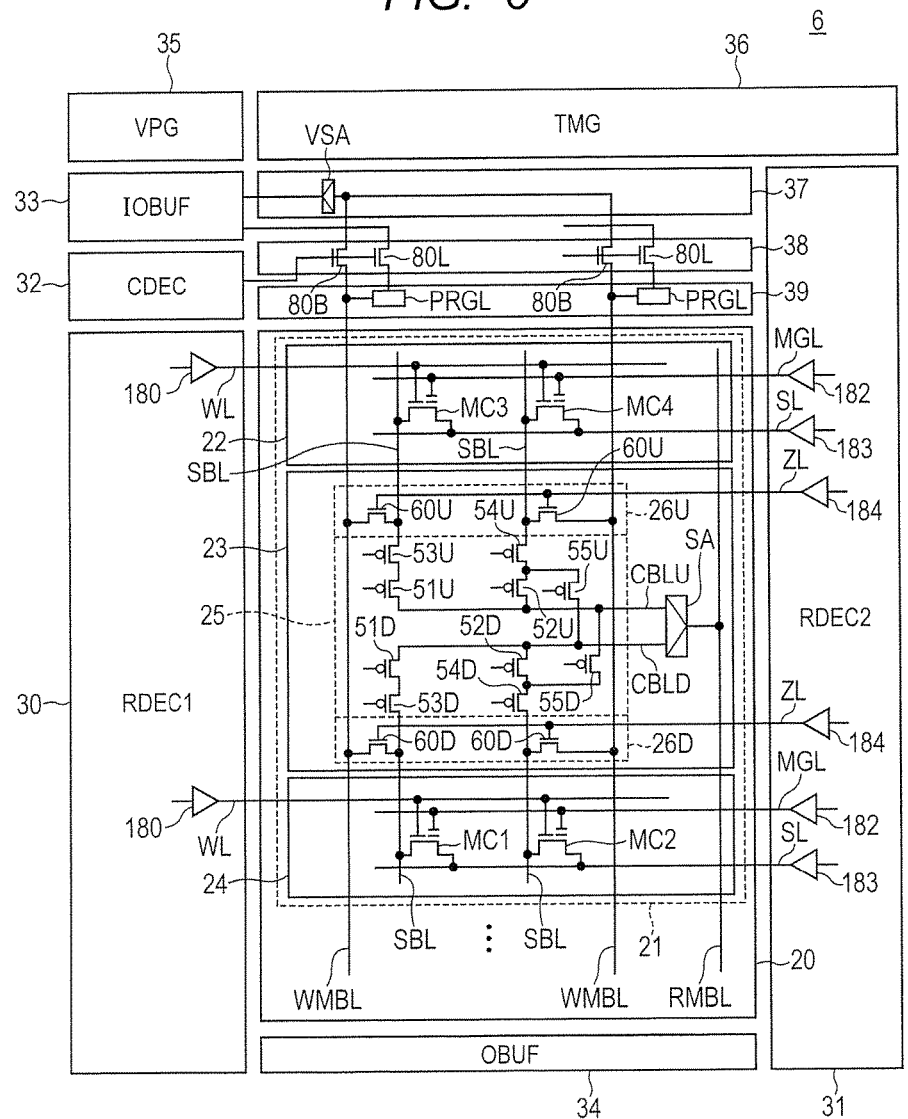
FIG. 6 is a block diagram expressing the configuration of a flash memory 6 in FIG. 1.

FIG. 6 is a block diagram expressing the configuration of the flash memory 6 in FIG. 1.

Referring to FIG. 6, the vertical direction of the plane of the drawing is called a column direction, and the horizontal direction of the plane of the drawing is called a row direction. The flash memory 6 includes a memory mat 20, an output buffer (OBUF) 34, a first row decoder (RDEC1) 30, and a second row decoder (RDEC2) 31.

The memory mat 20 includes, as a single configuration unit (hereinbelow, called a memory block 21), a hierarchy sense amplifier band 23, and memory arrays 22 and 24 provided on both sides in the column direction of the hierarchy sense amplifier band 23. In the memory mat 20, a plurality of such memory blocks 21 are disposed in the column direction (in FIG. 6, only one memory block 21 is representatively illustrated). Hereinbelow, the memory array 22 is also called an "upper memory array 22" and the memory array 24 is also called a "lower memory array 24".

The memory mat 20 includes the plurality of word lines WL extending in the row direction, the plurality of memory gate selection lines MGL extending in the row direction, the plurality of source lines SL extending in the row direction, and a plurality of sub-bit lines SBL extending in the column direction. The control signal lines are provided for each of the memory arrays 22 and 24.

The memory mat 20 includes a plurality of write-system main bit lines WMBL and a plurality of read-system bit lines RWBL commonly provided for the memory mat 20. The write-system main bit lines WMBL correspond to the plurality of sub-bit lines SBL and are coupled to the corresponding to sub-bit lines SBL via sub-bit line selectors 26U and 26D. That is, the writing-system main bit lines WMBL and the sub-bit lines SBL are hierarchically provided.

In the memory arrays 22 and 24, a plurality of memory cells MC are disposed in a matrix. Rows in the memory array correspond to the plurality of word lines WL and correspond to the plurality of memory gate selection lines MGL. That is, the word lines WL and the memory gate selection lines MGL are provided on the row unit basis of the memory array. The columns of the memory array correspond to the plurality of sub-bit lines SBL. That is, the sub-bit lines SBL are provided on the column unit basis of the memory array. The source line SL is coupled commonly to the plurality of rows in the memory array. At the time of reading data, the source line SL is coupled to a grounding node VSS.

FIG. 6 illustrates the case that each of the memory cells is a split-gate-type flash memory element. Each of the memory cells may be a stacked-gate-type flash memory element. In this case, the memory gate selection line MGL is not provided.

The characteristic of the flash memory 6 of FIG. 6 is the point that the complementary reading method of detecting and reading the difference of currents flowing in the two nonvolatile memory cells as storage of information of one bit and the reference current reading method of detecting and reading the difference between sum of currents of the two nonvolatile memory cells and reference current as storage of information of one bit can be switched.

In the flash memory 6, a pair of rewritable nonvolatile memory cells coupled to the common word line WL are used as twin cells. In the memory array 24 of FIG. 6, a pair of memory cells MC1 and MC2 coupled to the common word line WL is representatively illustrated. Similarly, in the memory array 22, a pair of memory cells MC3 and MC4 coupled to the common word line WL is representatively illustrated. In the specification, the memory cells MC1 and MC3 are called as "positive cells" and the memory cells MC2 and MC4 are called as "negative cells".

In the memory cells MC1 and MC2 configuring twin cells, the memory gates MG are coupled to the corresponding common memory gate selection line MGL, and the control gates CG are coupled to the corresponding common word line WL. The sources of the memory cells are coupled to the common source line SL. The memory cells MC1 and MC2 are further coupled to the corresponding sub-bit lines SBL on the column unit basis.

The hierarchy sense amplifier band 23 includes a sense amplifier SA, a read column selector 25, and the sub-bit line selectors 26U and 26D.

The sense amplifier SA has first and second input nodes, amplify the difference between current flowing in a first output signal line CBLU coupled to the first input node and current flowing in a second output signal line CBLD coupled to the second input node, and outputs the result of comparison of the current values (hereinbelow, the first output signal line CBLU is also called an upper output signal line, and the second output signal line CBLD is also called a lower output signal line). An output signal of the sense amplifier SA is transmitted to the output buffer (OBUF) 34 via the reading-system main bit line RMBL extending in the column direction. The output buffer 34 transmits the output of the sense amplifier SA to the CPU 2 in FIG. 1 and the like.

The read column selector 25 includes a plurality of PMOS transistors 51U to 54U and 51D to 54D and functions as a coupling switching unit of switching coupling between the sub-bit lines SBL and the output signal lines CBLU and CBLD by switching the PMOS transistors (hereinbelow, MOS transistors used as switches as described above will be also called MOS transistor switches). Basically, the sub-bit line SBL used in the upper memory array 22 is coupled to the upper output signal line CBLU via the PMOS (Positive-channel MOS) transistor switches (51U, 53U, 52U, 54U, and the like). Similarly, the sub-bit line SBL used in the lower memory array 24 is coupled to the lower output signal line CBLD via the PMOS transistor switches (51D, 53D, 52D, 54D, and the like).

Further, the read column selector 25 includes, in the case of the complementary reading method, PMOS transistor switches 55U and 55D for coupling the negative cells to the output signal line (CBLU or CBLD) opposite to that in the above-described basic case. For example, in the case of reading data of the twin cells comprised of the memory cells MC1 and MC2, the memory cell MC1 is coupled to the lower output signal line CBLD via the PMOS transistor switches 53D and 51D. The memory cell MC2 is coupled to the upper output signal line CBLU via the PMOS transistor switches 54D and 55D. Similarly, in the case of reading data of the twin cells comprised of the memory cells MC3 and MC4, the memory cell MC3 is coupled to the upper output signal line CBLU via the PMOS transistor switches 53U and 51U. The memory cell MC4 is coupled to the lower output signal line CBLD via the PMOS transistor switches 54U and 55U.

In the reference current reading method, the PMOS transistor switches 55U and 55D are always in an off state.

For example, in the case of reading data of the memory cells MC1 and MC2 provided for the lower memory array 24, the memory cells MC1 and MC2 are coupled to the lower output signal line CBLD via the PMOS transistor switches 51D to 54D. The upper output signal line CBLU is coupled to a not-illustrated reference current source. By setting the PMOS transistor switches 51U to 54U to the on state, the sub-bit line SBL provided for the memory cells MC3 and MC4 is also coupled to the upper output signal line CBLU. The reason is to add wiring capacity equal to that of the sub-bit line SBL coupled also to the lower output signal line CBLD to the upper output signal line CBLU.

The sub-bit line selectors 26U and 26D include a plurality of NMOS (Negative-channel MOS) transistor switches 60U and 60D, respectively. By switching the on/off state of the NMOS transistor switches 60U and 60D, the corresponding sub-bit lien SBL is selectively coupled to the writing-system main bit line WMBL.

Concretely, the sub bit line SBL provided for the memory array 22 is coupled to the corresponding main bit line WMBL via the NMOS transistor switch 60U. The sub bit line SBL provided for the memory array 24 is coupled to the corresponding main bit line WMBL via the NMOS transistor switch 60D. In the case of the first embodiment, the sub bit line selectors 26U and 26D are used only at the time of writing data and are not used at the time of reading data.

The first row decoder (RDEC1) 30 includes a driver 180 for selectively activating the word line WL. The second row decoder (RDEC2) 31 includes a driver 182 for selectively activating the memory gate line MGL and a driver 183 for selectively activating the source line SL. The second row decoder 31 further includes a driver 184 for selectively activating a control signal line ZL controlling the sub bit line selectors 26U and 26D. The control signal line ZL is coupled to the gates of the NMOS transistor switches 60U and 60D provided for the sub bit line selectors 26U and 26D. The selecting operation by the first and second row decoders 30 and 31 is according to address information in a reading access, data writing operation, and initializing operation (erasing operation).

The flash memory 6 further includes an input/output buffer (IOBUF) 33, a main bit line voltage control circuit 39, a column decoder (CDEC) 32, a rewriting column selector 38, a verifying circuit 37, a power supply circuit (VPG) 35, and a timing generator (TMG) 36.

The input/output buffer (IOBUF) 33 is coupled to the CPU 2 and the flash sequencer 7. The input/output buffer 33 receives write data from the flash sequencer 7. The input/output buffer 33 further outputs a determination result of a verify sense amplifier VSA to the flash sequencer 7. The input/output buffer 33 outputs read data to the CPU 2.

The main bit line voltage control circuit 39 includes a plurality of program latch circuits PRGL provided in correspondence to the writing-system main bit lines WMBL. The program latch circuit PRGL holds write data supplied via the input/output buffer 33. At the time of writing data, write current according to data ("1" or "0") held in the corresponding program latch circuit PRGL is selectively passed to the write-system main bit line WMBL.

The column decoder (CDEC) 32 generates a control signal for selecting the write-system main bit line WMBL or the like in accordance with address information or the like.

The rewriting column selector 38 includes an NMOS transistor switch 80B for selectively coupling each of the write-system main bit lines WMBL and the verify sense amplifier VSA, and an NMOS transistor switch 80L for selectively coupling the input/output buffer 33 and the program latch circuit PRGL. The NMOS transistor switches 80B and 80L are switched between on and off in accordance with a control signal from the column decoder 32. By turning on the NMOS transistor switch 80L, write data is supplied from the input/output buffer 33 to the corresponding program latch circuit PRGL.

The verifying circuit 37 determines whether data of a memory cell to be written and the write data held in the program latch circuit PRGL match or not, thereby determining whether desired data is written in the memory cell to be written. The verifying circuit 37 includes the verify sense amplifier VSA for reading the data of the memory cell to be written. The verify sense amplifier VSA is coupled to the write-system main bit line WMBL corresponding to the memory cell to be written by the selecting operation of the rewrite column selector 38 (that is, by turning on the corresponding NMOS transistor switch 80B).

The power supply circuit (VPG) 35 generates various operation voltages necessary for reading, writing, and initialization (erasure). The power supply voltage (the voltage of a power supply node VDD) among the plurality of voltages generated is power supply voltage of a CMOS circuit in the semiconductor device. The voltages supplied to the memory gate MG, the control gate CG, the source line SL, the well (WELL), and the bit line BL are generated and supplied by the power supply circuit (VPG) 35 under control of the flash sequencer 7.

The timing generator (TMG) 36 generates an internal control signal specifying an internal operation timing in accordance with an access strobe signal supplied from the CPU 2 or the like in FIG. 1, an access command supplied from the flash sequencer (FSQC) 7, and the like.

a5. Details of Read Circuit

Figure 7:
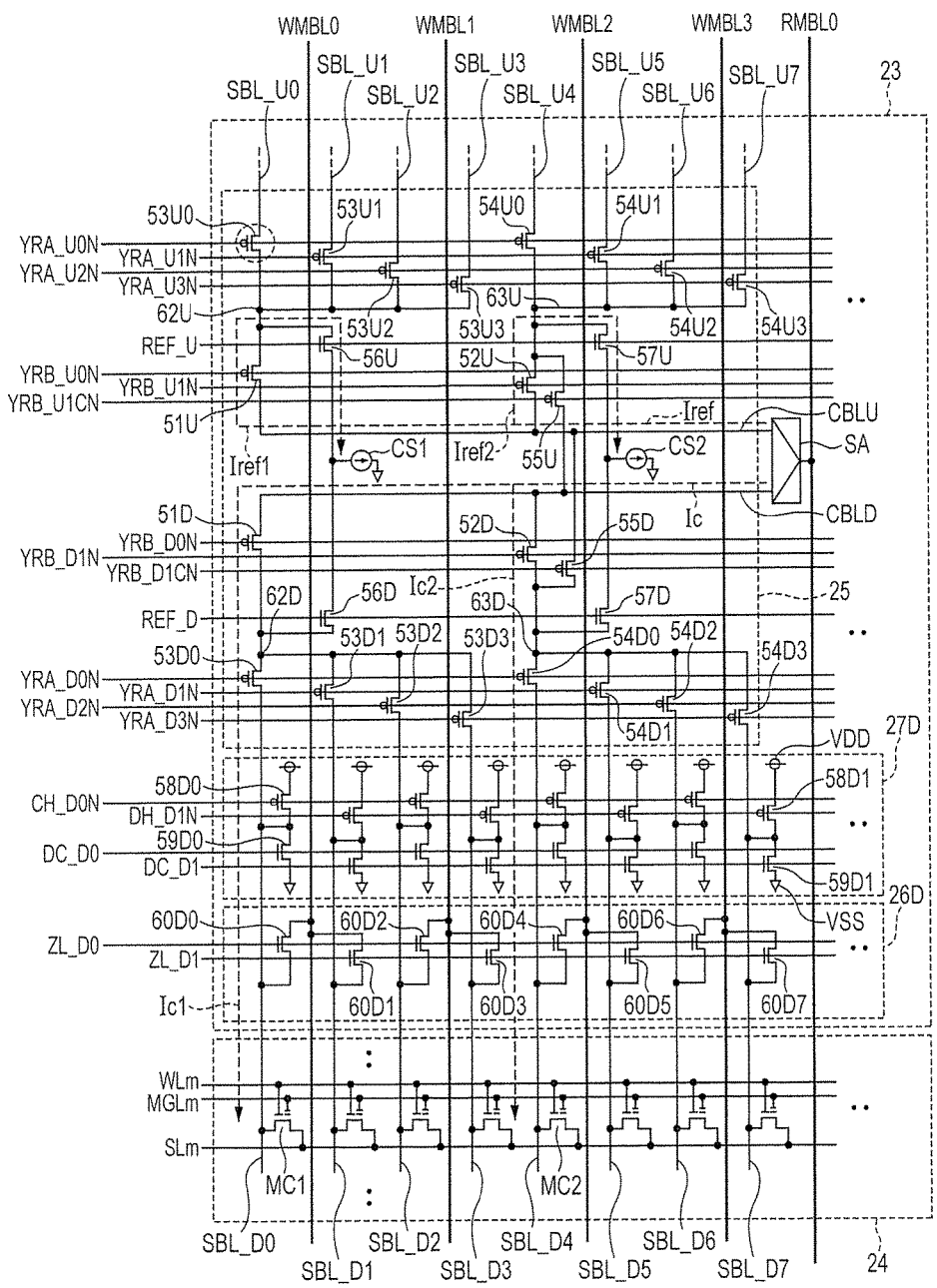
FIG. 7 is a diagram illustrating a detailed configuration of a hierarchy sense amplifier band in FIG. 6.

FIG. 7 is a diagram illustrating a detailed configuration of a hierarchy sense amplifier band in FIG. 6.

In FIG. 7, the configuration of the sense amplifier SA, the read column selector 25, and the lower sub-bit line selector 26D in the hierarchy sense amplifier band 23 in FIG. 6 and the configuration of the m-th row in the lower memory array 24 are illustrated. In FIG. 7, the configuration of a charge/discharge circuit 27D provided between the read column selector 25 and the sub-bit line selector 26D is also illustrated. Although not illustrated in FIG. 7, a charge/discharge circuit 27U having a configuration similar to that of the charge/discharge circuit 27D is provided also between the read column selector 25 and the upper sub-bit line selector 26U.

In FIG. 7, four write-system main bit lines WMBL0 to WMBL3, eight sub bit lines SBL_U0 to SBL_U7 provided for the upper memory array 22, eight sub bit lines SBL_D0 to SBL_D7 provided for the lower memory array 24, and one read-system main bit line RMBL0 are representatively illustrated. Although not illustrated in FIG. 7, in the actual flash memory 6, the bit lines are repetitively provided in the row direction.

Two sub bit lines SBL are assigned for one write-system main bit line WMBL in each memory array. Concretely, in the lower memory array 24, for the write-system main bit line WMBLi (where i=0 to 3), sub bit lines SBL_D2×i and SBL_D2×i+1 are assigned. In the upper memory array 22, for the write-system main bit line WMBLi (where i=0 to 3), sub bit lines SBL_U2×i and SBL_U2×i+1 are assigned.

Twin cells are comprised of memory cells coupled to different sub bit lines SBL and coupled to a common word line WL. Concretely, in the case of FIG. 7, in memory cells coupled to the sub bit lines SBL_D0 and SBL_D4, memory cells coupled to the common word line WL are twin cells. Similarly, memory cells coupled to the sub bit lines SBL_Di and SBL_Di+4 (where i=0 to 3) are twin cells. The memory cells coupled to the sub bit lines SBL_D0 to SBL_D3 are used as positive cells, and the memory cells coupled to the sub bit lines SBL_D4 to SBL_D7 are used as negative cells. The memory cells provided for the upper memory array 22 are similar to the above.

The sub bit line selector 26D includes NMOS transistor switches 60D0 to 60D7 corresponding to the sub bit lines SBL_D0 to SBL_D7, respectively, and control signal lines ZL_D0 and ZL_D1. Each of the NMOS transistor switches 60D0 to 60D7 is coupled between the corresponding sub bit line SBL and the write-system main bit line WMBL to which the corresponding sub bit line SBL is assigned. The control signal line ZL_D0 is coupled to the gates of the NMOS transistor switches 60D0, 60D2, 60D4, and 60D6 of even numbers, and the control signal line ZL_D1 is coupled to the gates of the NMOS transistor switches 60D1, 60D3, 60D5, and 60D7 of odd numbers.

The charge/discharge circuit 27D includes a plurality of PMOS transistor switches 58D0 corresponding to the sub bit lines SBL_D0, SBL_D2, SBL_D4, and SBL_D6 of even numbers, a plurality of PMOS transistor switches 58D1 corresponding to the sub bit lines SBL_D1, SBL_D3, SBL_D5, and SBL_D7 of odd numbers, and control signal lines CH_D0N and CH_D1N.

Each of the PMOS transistor switches 58D0 and 58D1 is coupled between the corresponding sub bit line SBL and the power supply node VDD. The control signal line CH_D0N is coupled to the gates of the PMOS transistors 58D0 of even numbers, and the control signal line CH_D1N is coupled to the gates of the PMOS transistors 58D1 of odd numbers.

The charge/discharge circuit 27D further includes a plurality of NMOS transistor switches 59D0 corresponding to the sub bit lines SBL_D0, SBL_D2, SBL_D4, and SBL_D6 of even numbers, a plurality of NMOS transistor switches 59D1 corresponding to the sub bit lines SBL_D1, SBL_D3, SBL_D5, and SBL_D7 of odd numbers, and control signal lines DC_D0 and DC_D1.

Each of the NMOS transistor switches 59D0 and 59D1 is coupled between the corresponding sub bit line SBL and the grounding node VSS. The control signal line DC_D0 is coupled to the gates of the NMOS transistors 59D0 of even numbers, and the control signal line DC_D1 is coupled to the gates of the NMOS transistors 59D1 of odd numbers.

Since the configuration of the charge/discharge circuit 27U corresponds to a configuration in which D as a suffix is replaced with U in the above description of the configuration of the charge/discharge circuit 27D, the description will not be given.

The read column selector 25 includes PMOS transistor switches 51D, 52D, 53D0 to 53D3, and 54D0 to 54D3 for selectively coupling the sub bit lines SBL_D0 to SBL_D7 provided for the lower memory array 24 to the output signal line CBLD on the lower side. Further, the read column selector 25 includes PMOS transistor switches 51U, 52U, 53U0 to 53U3, and 54U0 to 54U3 for selectively coupling the sub bit lines SBL_U0 to SBL_U7 provided for the upper memory array 22 to the output signal line CBLU on the upper side.

Concrete coupling relations of the PMOS transistor switches are as follows. First, the PMOS transistor switches 53D0 to 53D3 correspond to the sub bit lines SBL_D0 to SBL_D3, respectively, and each of them is coupled between the corresponding sub bit line SBL and a common node 62D. The PMOS transistor switch 51D is coupled between the common node 62D and the lower output signal line CBLD. The PMOS transistor switches 54D0 to 54D3 correspond to the sub bit lines SBL_D4 to SBL_D7, respectively, and each of them is coupled between the corresponding sub bit line SBL and a common node 63D. The PMOS transistor switch 52D is coupled between the common node 63D and the lower output signal line CBLD.

Similarly, the PMOS transistor switches 53U0 to 53U3 correspond to the sub bit lines SBL_U0 to SBL_U3, respectively, and each of them is coupled between the corresponding sub bit line SBL and a common node 62U. The PMOS transistor switch 51U is coupled between the common node 62U and the upper output signal line CBLU. The PMOS transistor switches 54U0 to 54U3 correspond to the sub bit lines SBL_U4 to SBL_U7, respectively, and each of them is coupled between the corresponding sub bit line SBL and a common node 63U. The PMOS transistor switch 52U is coupled between the common node 63U and the upper output signal line CBLD.

The read column selector 25 further includes control signal lines YRB_D0N, YRB_D1N, YRA_D0N to YRA_D0N to YRA_D3N, YRB_U0N, YRB_U1N, and YRA_U0N to YRA_U3N for switching on/off of the PMOS transistor switches.

Concretely, the control signal lines YRB_D0N and YRB_D1N are coupled to the gates of the PMOS transistor switches 51D and 52D, respectively. A control signal line YRA_DiN (i=0 to 3) is coupled to the gates of PMOS transistor switches 53Di and 54Di. The reason why each of the control signal lines YRA_DiN is coupled to two PMOS transistor switches 53Di and 54Di is to simultaneously select two sub bit lines SBL corresponding to twin cells.

Similarly, the control signal lines YRB_U0N and YRB_U1N are coupled to the gates of the PMOS transistor switches 51U and 52U, respectively. A control signal line YRA_UiN (i=0 to 3) is coupled to the gates of PMOS transistor switches 53Ui and 54Ui.

The read column selector 25 further includes constant current sources CS1 and CS2, NMOS transistor switches 56U and 57U for switching coupling between the constant current sources CS1 and CS2 and the upper output signal line CBLU, and NMOS transistor switches 56D and 57D for switching coupling between the constant current sources CS1 and CS2 and the lower output signal line CBLD.

The PMOS transistors 56U and 56D are coupled between the common nodes 62U and 62D and the constant current source CS1, respectively. The PMOS transistors 57U and 57D are coupled between the common nodes 63U and 63D and the constant current source CS2, respectively. The read column selector 25 further includes a control signal line REF_U coupled to the gates of the NMOS transistor switches 56U and 57U and a control signal line REF_D coupled to the gates of the NMOS transistor switches 56D and 57D.

The current sources CS1 and CS2 are comprised of, for example, NMOS transistors having gates to which constant voltage is applied. The hierarchical sense amplifier band 23 may be configured by providing reference cells corresponding to the current sources CS1 and CS2 in each memory cell and comparing current flowing in the reference cells and current flowing in a memory cell to be read.

The read column selector 25 further includes the PMOS transistor switch 55D for switching coupling between negative cells of the lower memory array 24 and the upper output signal line CBLU and the PMOS transistor switch 55U for switching coupling between negative cells of the upper memory array 22 and the lower output signal line CBLD. The PMOS transistor switch 55D is coupled between the common node 63D and the upper output signal line CBLU, and the PMOS transistor switch 55U is coupled between the common node 63U and the lower output signal line CBLD.

The case where the last number of the reference numeral in notation of a control signal line is N means that the control signal line is activated by a low-level (L-level) signal and the PMOS transistor switch coupled to the activated control signal line enters an on state. The case where the last number of the reference numeral in notation of the control signal line is not N means that the control signal line is activated by a high-level (H-level) signal and the NMOS transistor switch coupled to the activated control signal line enters an on state.

a6. Paths of Memory Cell Current and Reference Current in Reference Current Reading Method Next, referring to FIG. 7, the path of a cell current Ic and the path of a reference current Iref in the case of reading data in twin cells (memory cells MC1 and MC2) in the reference current reading method will be described.

In the case of reading data in the twin cells (memory cells MC1 and MC2), the word line WLm coupled to the control gates of the memory cells MC1 and MC2 is activated to the H level. Further, by activating the control signal lines YRA_D0N, YRB_D0N, and YRB_D1N, the cell current Ic is generated. The cell current Ic is sum current of cell currents Ic1 and Ic2. The cell current Ic1 flows from the sense amplifier SA to the source line SL via, in order, the output signal line CBLD, the PMOS transistor switches 51D and 53D0, the sub bit line SBL_D0, and the memory cell MC1. The cell current Ic2 flows from the sense amplifier SA to the source line SL via, in order, the output signal line CBLD, the PMOS transistor switches 52D and 54D0, the sub bit line SBL_D4, and the memory cell MC2. At the time of reading data, the source line SL is coupled to the grounding node VSS.

To generate the reference current Iref, the control signal lines YRB_U0N, YRB_U1N, and REF_U are activated. The reference current Iref becomes sum current of the reference currents Iref1 and Iref2. The reference current Iref1 flows from the sense amplifier SA to the grounding node VSS via, in order, the output signal line CBLU, the PMOS transistor switches 51U and 56U, and the current source CS1. The cell current Iref2 flows from the sense amplifier SA to the grounding node VSS via, in order, the output signal line CBLU, the PMOS transistor switches 52U and 57U, and the current source CS2.

By the current sources CS1 and CS2, the magnitude of the reference current Iref is adjusted. At the time of generating the reference current Iref, by making the control signal line YRA_U0N active, the PMOS transistor switches 53U0 and 54U0 are turned on. Consequently, the wiring capacity of the sub bit lines SBL_U0 and SBL_U4 is added to the output signal CBLU on the current source CS1 side and the current source CS2 side. The value of the wiring capacity of the sub bit lines SBL_U0 and SBL_U4 is almost equal to that of the wiring capacity of the sub bit lines SBL_D0 and SBL_D4 coupled to the memory cells MC1 and MC2. Therefore, since the load of the first input node of the sense amplifier SA and the load of the second input node can be made almost equal, accurate comparison between the cell current Ic and the reference current Iref (that is, accurate detection of data of the twin cells (memory cells MC1 and MC2)) can be performed.

The sense amplifier SA amplifies the difference between the cell current Ic and the reference current Iref. An output signal of the sense amplifier SA is transmitted to the output buffer 34 via the read-system main bit line RMBL0.

In the case of the reference current reading method, control signal lines YRB_U1CN and YRB_D1CN are maintained in a non-active state (H level). That is, the PMOS transistor switches 55U and 55D are always in the off state.

a7. Path of Memory Cell Current in Complementary Reading Method

Figure 8:
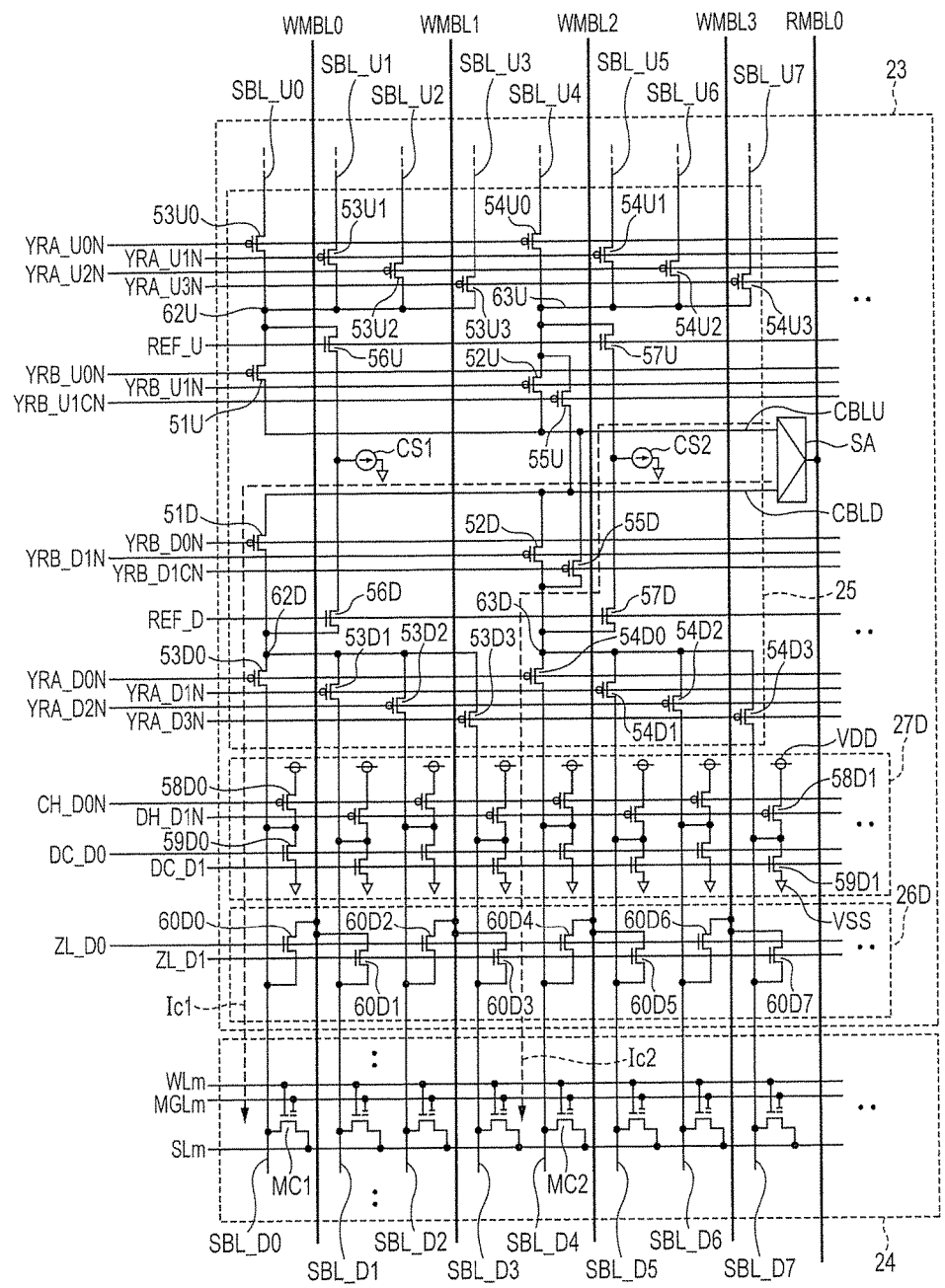
FIG. 8 is a diagram illustrating paths of memory cell current in the case of a complementary reading method in the circuit configuration of FIG. 7.

FIG. 8 is a diagram illustrating paths of memory cell current in the case of a complementary reading method in the circuit configuration of FIG. 7.

In FIG. 8, in the case of reading data in the memory cells MC1 and MC2 configuring the twin cells, the path of the cell current Ic1 flowing in the memory cell MC1 and the path of the cell current Ic2 flowing in the memory cell MC2 are illustrated.

In the case of reading data in the memory cells MC1 and MC2, the word line WLm commonly coupled to the memory cells MC1 and MC2 is activated. By activating the control signal lines YRA_D0N, YRB_D0N, and YRB_D1CN in this state, the cell currents Ic1 and Ic2 are generated. The cell current Ic1 flows from the sense amplifier SA to the source line SL via, in order, the output signal line CBLD, the PMOS transistor switches 51D and 53D0, the sub bit line SB+_D0, and the memory cell MC1. The cell current Ic2 flows from the sense amplifier SA to the source line SL via, in order, the output signal line CBLU, the PMOS transistor switches 55D and 54D0, the sub bit line SBL_D4, and the memory cell MC2. At the time of reading data, the source line SL is coupled to the grounding node VSS. The sense amplifier SA amplifies the difference between the cell currents Ic1 and Ic2. An output signal of the sense amplifier SA is transmitted to the output buffer 34 via the read-system main bit line RMBL0.

In the case of the complementary reading method, the control signal lines REF_U and REF_D are always made inactive to the L level, and the control signal lines YRB_U1N and YRB_D1N are always made inactive to the H level. That is, the NMOS transistors 56U, 56D, 57U, and 57D, and the PMOS transistors 52U and 52D are always in the off state.

a8. Drive Circuit of Control Signal Line of Hierarchy Sense Amplifier Band

Figure 9B:
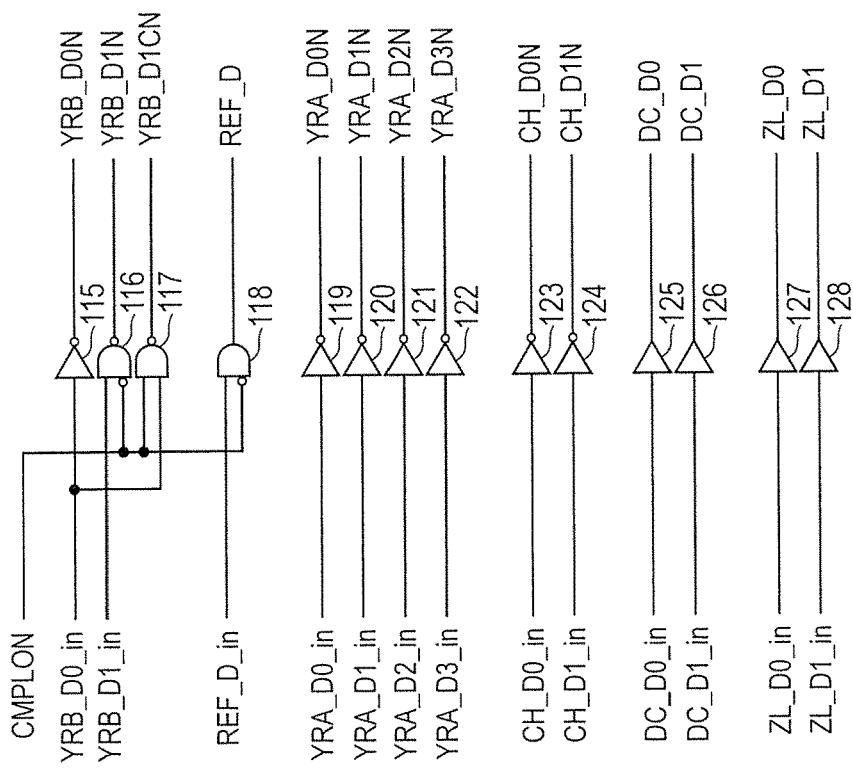
FIGS. 9A and 9B are diagrams illustrating the configuration of a drive circuit for driving control signal lines in the hierarchy sense amplifier band in FIG. 7.
Figure 9A:
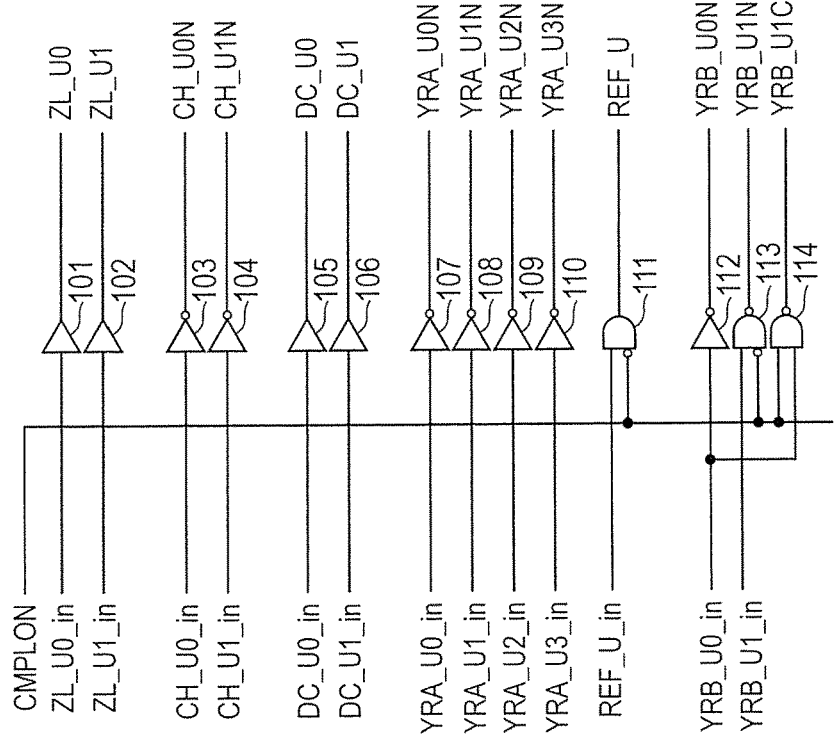

FIGS. 9A and 9B are diagrams illustrating the configuration of a drive circuit for driving control signal lines in the hierarchy sense amplifier band in FIG. 7.

FIG. 9A illustrates the configuration of a drive circuit for a control signal line related to reading and writing of the upper memory array 22 in FIG. 6. FIG. 9B illustrates a drive circuit for a control signal line related to reading and writing of the lower memory array 24 in FIG. 6.

A control signal CMPLON in the input signals in FIGS. 9A and 9B is a signal for discriminating whether a memory cell to be read or written is in the complementary reading method or the reference current reading method, and is supplied from the flash sequencer (FSQC) 7 in FIG. 1. In the case of the complementary reading method, the control signal CMPLON becomes the H level ("1"). In the case of the reference current reading method, the control signal CMPON becomes the L level ("0").

Other input signals are generated by the column decoder (CDEC) 32 on the basis of a control signal from the flash sequencer (FSQC) 7, a control signal from the timing generator 36 in FIG. 6, and an address input to the input/output buffer (IOBUF) 33. Particularly, control signals YRA_U0_in to YRA_U3_in and YRA_D0_in to YRA_D3_in are column selection signals based on a lower address, and YRB_U0_in to YRB_U3_in and YRB_D0_in to YRB_D3_in are column selection signals based on an upper address.

Referring to FIG. 9A, signals supplied to control signal lines ZL_U0, ZL_U1, DC_U0, and DC_U1 are generated by amplifying control signals ZL_U0_in, ZL_U1_in, DC_U0_in, and DC_U1_in by buffers 101, 102, 105, and 106. Similarly, referring to FIG. 9B, signals supplied to control signal lines ZL_D0, ZL_D1, DC_D0, and DC_D1 are generated by amplifying control signals ZL_D0_in, ZL_D1_in, DC_D0_in, and DC_D1_in by buffers 127, 128, 125, and 126.

Referring to FIG. 9A, signals supplied to the control signal lines CH_U0N, CH_U1N, YRA_U0N to YRA_U3N, and YRB_U0N are generated by inverting and amplifying control signals CH_U0_in, CH_U1_in, YRA_U0_in to YRA_U3_in, and YRB_U0_in by inverters 103, 104, 107 to 110, and 112.

Similarly, referring to FIG. 9B, signals supplied to the control signal lines CH_D0N, CH_D1N, YRA_D0N to YRA_D3N, and YRB_D0N are generated by inverting and amplifying control signals CH_D0_in, CH_D1_in, YRA_D0_in to YRA_D3_in, and YRB_D0_in by inverters 123, 124, 119 to 122, and 115.

Referring to FIG. 9A, signals supplied to control signal lines REF_U, YRB_U1N, and YRB_U1CN are generated by logic gates 111, 113, and 114, respectively. Concretely, in the case where the control signal CMPLON="0" (reference current reading method), the logic gate 111 outputs a signal obtained by amplifying the control signal REF_U_in to the control signal line REF_U. In the case where the control signal CMPLON="1" (complementary reading method), the logic gate 111 makes the control signal line REF_U inactive by outputting a signal of the L level ("0") regardless of the control signal REF_U_in.

In the case where the control signal CMPLON="0" (reference current reading method), the logic gate 113 outputs a signal obtained by inverting and amplifying the control signal YRB_U1_in to the control signal line YRB_U1N. In the case where the control signal CMPLON="1" (complementary reading method), the logic gate 113 makes the control signal line YRB_U1N inactive by outputting a signal of the H level ("1") regardless of the control signal YRB_U1_in.

In the case where the control signal CMPLON="0" (reference current reading method), the logic gate 114 makes the control signal line YRB_U1CN inactive by outputting a signal of the H level ("1") regardless of the control signal YRB_U1_in. In the case where the control signal CMPLON="1" (complementary reading method), the logic gate 114 outputs a signal obtained by inverting and amplifying the control signal YRB_U0_in to the control signal line YRB_U1CN.

Similarly, referring to FIG. 9B, signals supplied to control signal lines REF_D, YRB_D1N, and YRB_D1CN are generated by logic gates 118, 116, and 117, respectively. Concretely, in the case where the control signal CMPLON="0" (reference current reading method), the logic gate 118 outputs a signal obtained by amplifying the control signal REF_D_in to the control signal line REF_D. In the case where the control signal CMPLON="1" (complementary reading method), the logic gate 118 makes the control signal line REF_D inactive by outputting a signal of the L level ("0") regardless of the control signal REF_D_in.

In the case where the control signal CMPLON="0" (reference current reading method), the logic gate 116 outputs a signal obtained by inverting and amplifying the control signal YRB_D1_in to the control signal line YRB_D1N. In the case where the control signal CMPLON="1" (complementary reading method), the logic gate 116 makes the control signal line YRB_D1N inactive by outputting a signal of the H level ("1") regardless of the control signal YRB_D1_in.

In the case where the control signal CMPLON="0" (reference current reading method), the logic gate 117 makes the control signal line YRB_D1CN inactive by outputting a signal of the H level ("1") regardless of the control signal YRB_D1_in. In the case where the control signal CMPLON="1" (complementary reading method), the logic gate 117 outputs a signal obtained by inverting and amplifying the control signal YRB_D0_in to the control signal line YRB_D1CN.

a9. Example of Control Signal CMPLON Generation Circuit

Figure 10:
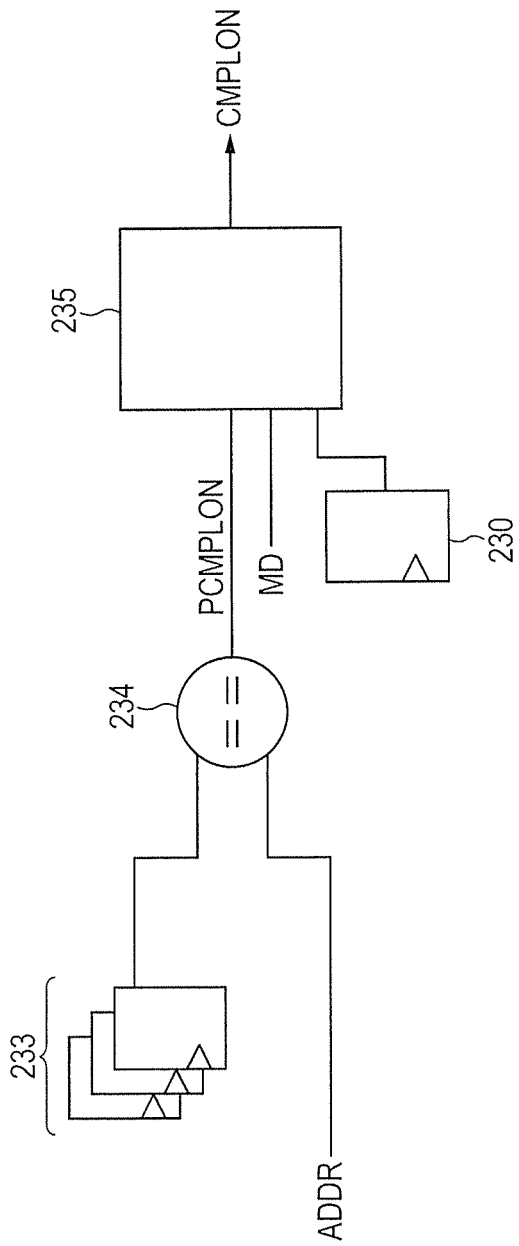
FIG. 10 is a diagram illustrating an example of a control signal CMPLON generation circuit in FIGS. 9A and 9B.

FIG. 10 is a diagram illustrating an example of a control signal CMPLON generation circuit in FIGS. 9A and 9B.

The circuit in FIG. 10 is provided for the flash sequencer (FSQC) 7 in FIG. 6. The circuit includes the address assignment register 233, a comparator 234, the security state register 230, and an adjusting circuit 235.

The comparator 234 compares address information ADDR of a read destination which is output by the CPU 2 at the time of reading the flash memory 6 and address information stored in the flash assignment register 233 and, when the information matches, asserts a control signal PCMPLON.

In the address assignment register 233, address information of a region which is desired to be used in the complementary reading method in a plurality of regions configuring the memory mat 20 in FIG. 6 is preliminarily stored.

For example, when the user region 221 is designated by the address information ADDR, the control signal PCMPLON="1" is output.

The control signal PCMPLON is input to the adjusting circuit 235. The adjusting circuit 235 adjusts the control signal PCMPLON as necessary and outputs the resultant signal as the control signal CMPLON.

Concretely, the adjusting circuit 235 outputs the control signal CMPLON on the basis of a mode signal MD and the value of a read inhibition flag of the security state register 230.

In the normal case, the adjusting circuit 235 outputs the control signal PCMPLON as the control signal CMPLON as it is.

For example, the adjusting circuit 235 outputs a control signal PCMPLON ("1") as a control signal CMPLON ("1") and sets it in the complementary reading method.

On the other hand, in the embodiment, a boot mode signal is input as the mode signal MD and, in the case where a read inhibition flag is valid, the control signal PCMPLON ("1") is changed to the control signal CMPLON ("0" (reference reading method)).

When reading timings or the like have to be changed in the reference current reading method and the complementary reading method, by changing a read timing signal generated by the timing generator 36 in FIG. 6 on the basis of the CMPLON signal, stable reading can be performed.

B. Description of Operation of Microcomputer

B1. Description of Boot Mode and User Mode

In a boot mode, for example, the CPU 2 can execute a program stored in the boot firmware storage region 220.

For example, when the boot mode is input as the mode signal MD, the microcomputer 1 starts executing a program in the boot firmware storage region 220. In the program, a command from a programmer received by the serial IO 9 is analyzed and, according to an operation instructed by the programmer, control of the flash sequencer 7 and the reading process of the flash memory 6 are executed.

For example, when a command instructing writing/erasure is received from a programmer, the flash sequencer 7 is controlled to execute writing/erasing of the flash memory 6.

When a command instructing reading is received from a programmer, data read from the region in the flash memory 6 instructed is transmitted to the programmer via the serial IO 9.

For example, when a user mode is input as the mode signal MD, the microcomputer 1 starts executing the program in the user region 221.

The program in the user region 221 includes an interface control program, an erasure control program, a write control program, and the like developed by the user. By executing any of the programs, the flash memory can be erased or written in accordance with the program.

During resetting operation of the microcomputer 1, the flash sequencer 7 reads setting information from the security setting region 222 in the flash memory 6 and copies it into the security state register 230. In the setting information copied from the security setting region 222 to the security state register 230, a flag (read inhibition flag) determining whether reading from the programmer is inhibited or not is stored.

B2. Description of Operation of User Region 221

The flash sequencer 7 sets the reading method of the user region 221 to the complementary reading method at the time of writing/erasing of the user region 221.

In the case of writing data to the user region 221, complementary data is written in the memory cells configuring the twin cells.

When data in the user region 221 is erased, both of the memory cells configuring the twin cells are in an erased state.

On the other hand, in the case other than the writing/erasing of the user region 221, the flash sequencer 7 switches the reading method of the user region 221 under a predetermined condition. Concretely, the complementary reading method is switched to the reference reading method. In the embodiment, when the user region 221 is read in the case where a boot mode signal is input as the mode signal MD and the read inhibition flag in the security state register 230 is valid, the control signal CMPLON is changed to "0" (reference reading method).

Accompanying the change, the reading method is switched from the complementary reading method to the reference reading method.

FIG. 11 is a diagram illustrating data in the case of reading the user region 221.

As illustrated in FIG. 11, when the boot mode signal is input as the mode signal MD and the read inhibition flag of the security state register 230 is valid, the flash sequencer 7 sets the reading method of the flash memory 6 to the reference current reading method.

In the other cases, the flash sequencer 7 sets the reading method of the flash memory 6 to the complementary reading method. When an erased region in the user region 221 is read by the reference current reading method, the flash memory outputs a value indicative of erasure (for example, all of data is "1").

In the case of reading a written region in which complementary data is stored in the memory cells MC1 and MC2 by the reference current reading method, sum current flowing in the memory cells MC1 and MC2 becomes close to the reference current. The sum current is an intermediate value of the current flowing in the case of writing cell data "0" in the memory cells MC1 and MC2 and the current flowing in the case of writing cell data "1" in the memory cells MC1 and MC2. Therefore, indeterminate data is output from the flash memory 6.

On the other hand, in the case of reading a written region by the complementary reading method in the user region 221, the flash memory 6 outputs a written value.

In the case of reading an erased region by the complementary reading method, a read value changes according to a threshold difference of the two memory cells in the erasure state, so that the flash memory 6 outputs an indeterminate value.

As there is a case that the threshold difference between two memory cells depends on data which is written before erasure, there is the possibility that the flash memory 6 outputs the data before erasure.

Therefore, as described above, when the boot mode signal is input as the mode signal MD and the read inhibition flag of the security state register 230 is valid, by changing the control signal CMPLON to "0" (reference current reading method), security performance can be improved so that data before erasure cannot be read from the region from which data was erased.

As described above, when the boot mode signal is input as the mode signal MD and the read inhibition flag of the security state register 230 is valid, by changing the control signal CMPLON to "0" (reference current reading method), even in the case of reading data from a written region, as data becomes indeterminate, security performance can be improved so that the data cannot be read.

Therefore, leakage of data to the outside of the microcomputer 1 can be prevented.

In the embodiment, the security setting information is copied to the flash sequencer 7 during the resetting operation of the microcomputer 1. However, in the case where the security function can be realized by reading the security setting information in the flash memory 6 each time operation to be protected is generated, copying to the security state register 230 may not be performed during the resetting operation.

Second Embodiment

In the foregoing first embodiment, the method of improving the security performance by changing the reading method has been described.

In a second embodiment, a method of switching an erasing method will be described.

Figure 12:
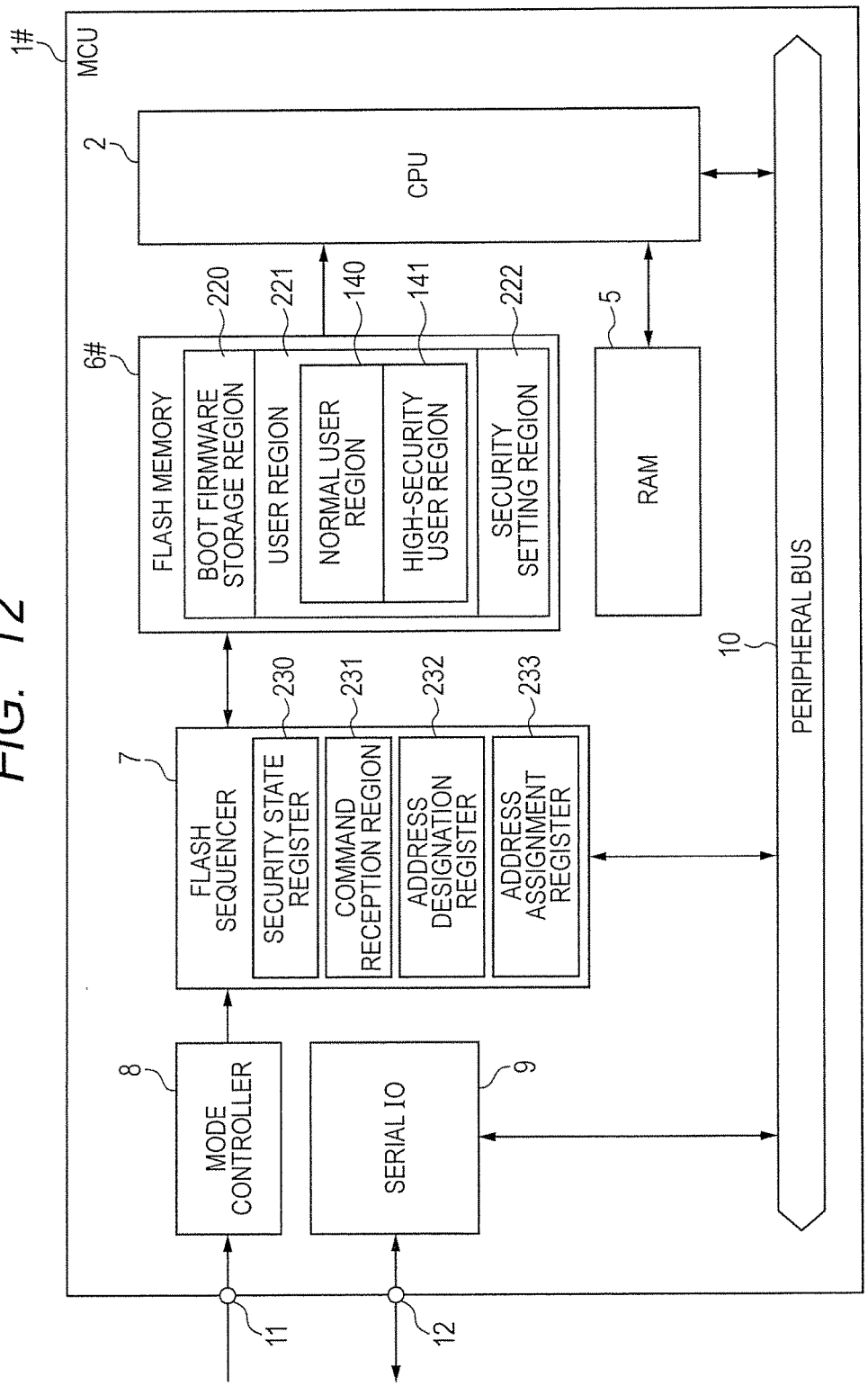
FIG. 12 is a block diagram illustrating the configuration of a semiconductor device based on a second embodiment.

FIG. 12 is a block diagram illustrating the configuration of a semiconductor device based on the second embodiment.

Referring to FIG. 12, the different points are that the microcomputer 1 is replaced to a microcomputer 1# and the flash memory 6 is replaced to a flash memory 6#.

The user region 221 in the flash memory 6# is divided into a normal user region 140 in which normal data is stored and a high-security user region 141 in which high-security data is stored.

In the embodiment, the erasing method is switched on the basis of whether the read inhibition flag stored in the security state register 230 is valid or invalid.

Concretely, when a command indicative of erasure is received in the command reception region 231, the flash sequencer 7 checks the security state register 230. When it is determined that the read inhibition flag is valid, erasure in a high-security initialize mode is executed. On the other hand, when the read inhibition flag is invalid, erasure in a high-speed initialize mode is executed.

During resetting operation of the microcomputer 1#, the flash sequencer 7 reads setting information from the security setting region 222 in the flash memory 6# and copies it into the security state register 230. The setting information copied from the security setting region 222 to the security state register 230 includes a flag (read inhibition flag) determining whether reading from the programmer is inhibited or not.

Figure 13:
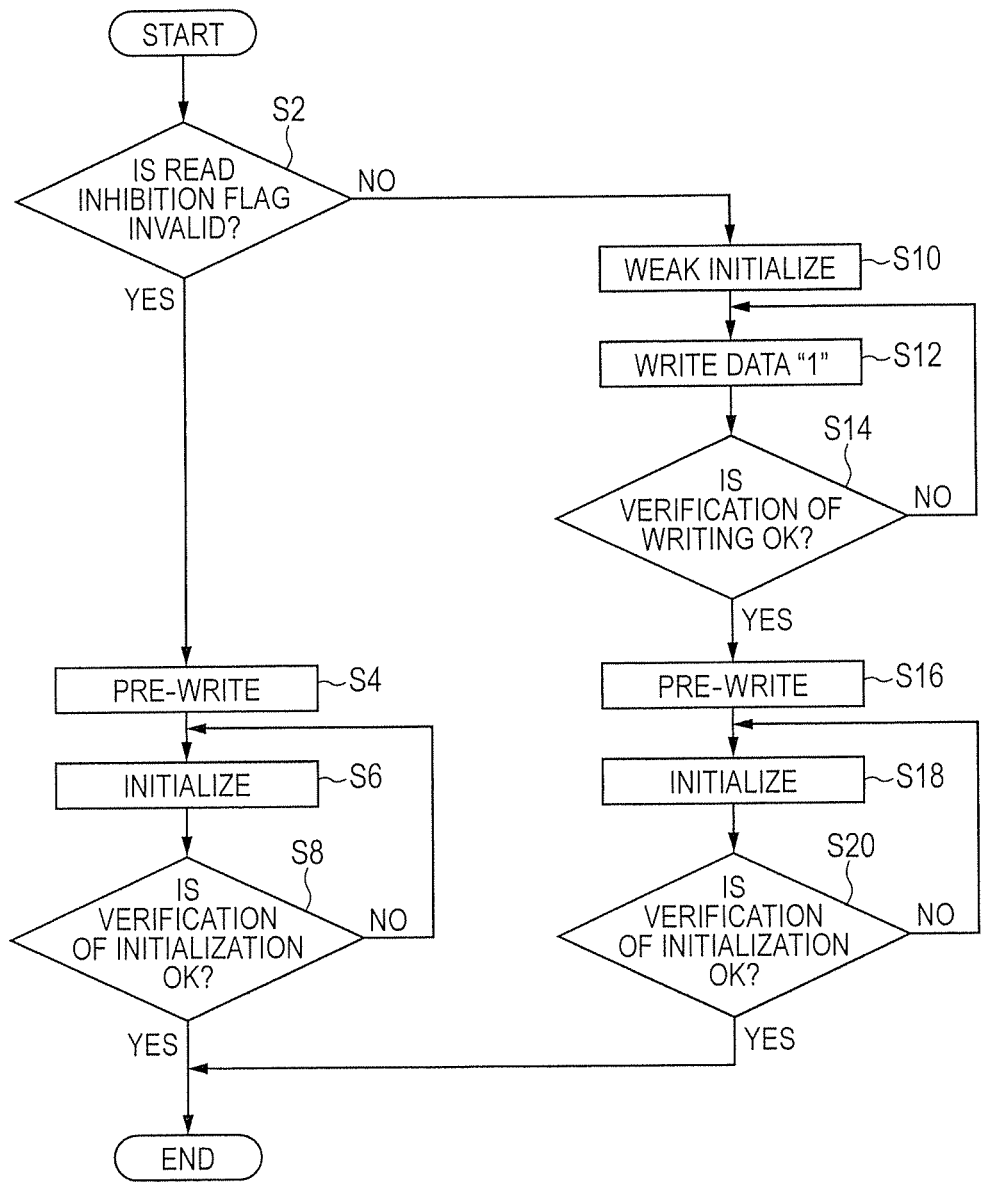
FIG. 13 is a diagram illustrating an erasure flow based on the second embodiment.

FIG. 13 is a diagram illustrating an erasure flow based on the second embodiment.

Referring to FIG. 13, the flash sequencer 7 determines whether the read inhibition flag is valid or not (step S2).

When it is determined that the read inhibition flag is invalid (YES in step S2), the flash sequencer 7 performs pre-write control on the memory cells MC1 and MC2 in an address designated by the address designation register 232 (step S4). As a result of performing the pre-write control, the threshold voltage Vth of the memory cells becomes high.

Next, the flash sequencer 7 performs initialize control on the memory cells MC1 and MC2 in the designated address (step S6). As a result of performing the initialize control, the threshold voltage Vth of the memory cells becomes a low-threshold-voltage state.

Subsequently, the flash sequencer 7 determines whether or not the designated memory cells MC1 and MC2 have reached a low-threshold-voltage state as a target (verification of initialization) (step S8). Concretely, the verifying circuit 37 determines whether cell data of the memory cells MC1 and MC2 in the designated address has reached the low-threshold-voltage state or not.

In step S8, when it is determined that the cell data in the memory cells MC1 and MC2 has reached the low-threshold-voltage state on the basis of the determination result of the verifying circuit 37 (YES in step S8), the control of the erasure flow is finished (END). On the other hand, when it is determined that the cell data in the memory cells MC1 and MC2 has not reached the low-threshold-voltage state (NO in step S8), the flash sequencer 7 outputs an instruction to perform the initialize control again to the flash memory 6#.

On the other hand, in step S2, when it is determined that the read inhibition flag is not invalid, that is, the read inhibition flag is valid (NO in step S2), the flash sequencer 7 performs weak initialize control on the memory cells MC1 and MC2 in the address designated by the address designation register 232 (step S10). Concretely, the power supply circuit 35 applies voltages of BL=Hi-Z (high impedance state), CG=1.5V, MG=−5V, SL=6V, and WELL=0V for 5 μs to the memory cells MC1 and MC2 in the designated address. In reality, there is delay time until target voltage (for example, MG=−5V) is applied to the memory cells MC1 and MC2, so that time in which the target voltage is applied to the memory cells MC1 and MC2 is shorter than 5 μs only by the delay time.

Next, the flash sequencer 7 performs a control of writing data "1" (step S12). Concretely, the power supply circuit 35 applies voltages of BL=0V, CG=1.5V, MG=10V, SL=6V, and WELL=0V for 5 μs to the memory cell MC2 in the designated address. As a result of applying the target voltages, the threshold voltage Vth of the memory cell MC2 becomes 5V.

Subsequently, the flash sequencer 7 checks whether the voltage of the designated memory cells MC1 and MC2 has reached the target threshold voltage Vth or not (verification of writing) (step S14). Concretely, the power supply circuit 35 applies voltages of BL=1.5V, CG=1.5V, MG=5V, SL=0V, and WELL=0V for 1 μs to the memory cells MC1 and MC2.

The verifying circuit 37 determines whether data is correctly written or not on the basis of cell data output from the memory cells MC1 and MC2 in the designated address.

When it is determined that data is written correctly as a determination result of the verifying circuit 37 (YES in step S14), the flash sequencer 7 advances to the next initialize step (step S16). On the other hand, when it is determined that data is not written correctly (NO in step S14), the flash sequencer 7 outputs an instruction to perform the control of writing data "1" again to the flash memory 6#.

In step S16, pre-write control is performed. As a result of performing the pre-write control, the threshold voltage Vth of the memory cells becomes high.

Next, the flash sequencer 7 sets the threshold voltage Vth of the memory cells MC1 and MC2 in the designated address to the low-threshold-voltage state (step S18). Concretely, the power supply circuit 35 applies voltages of BL=Hi-Z (high impedance state), CG=1.5V, MG=−10V, SL=6V, and WELL=0V for 50 μs to the memory cells MC1 and MC2.

Next, the flash sequencer 7 determines whether the designated memory cells MC1 and MC2 have reached the target low-threshold-voltage state or not (verification of initialization) (step S20).

Concretely, the verifying circuit 37 determines whether the cell data in the memory cells MC1 and MC2 in the designated address has reached the low-threshold-voltage state or not.

In step S20, when it is determined that the cell data in the memory cells MC1 and MC2 has reached the low-threshold-voltage state on the basis of the determination result of the verifying circuit 37 (YES in step S20), the control of the erasure flow is finished (END). On the other hand, when it is determined that the cell data in the memory cells MC1 and MC2 has not reached the low-threshold-voltage state (NO in step S20), the flash sequencer 7 outputs an instruction to perform the initialize control again to the flash memory 6#.

Figure 14:
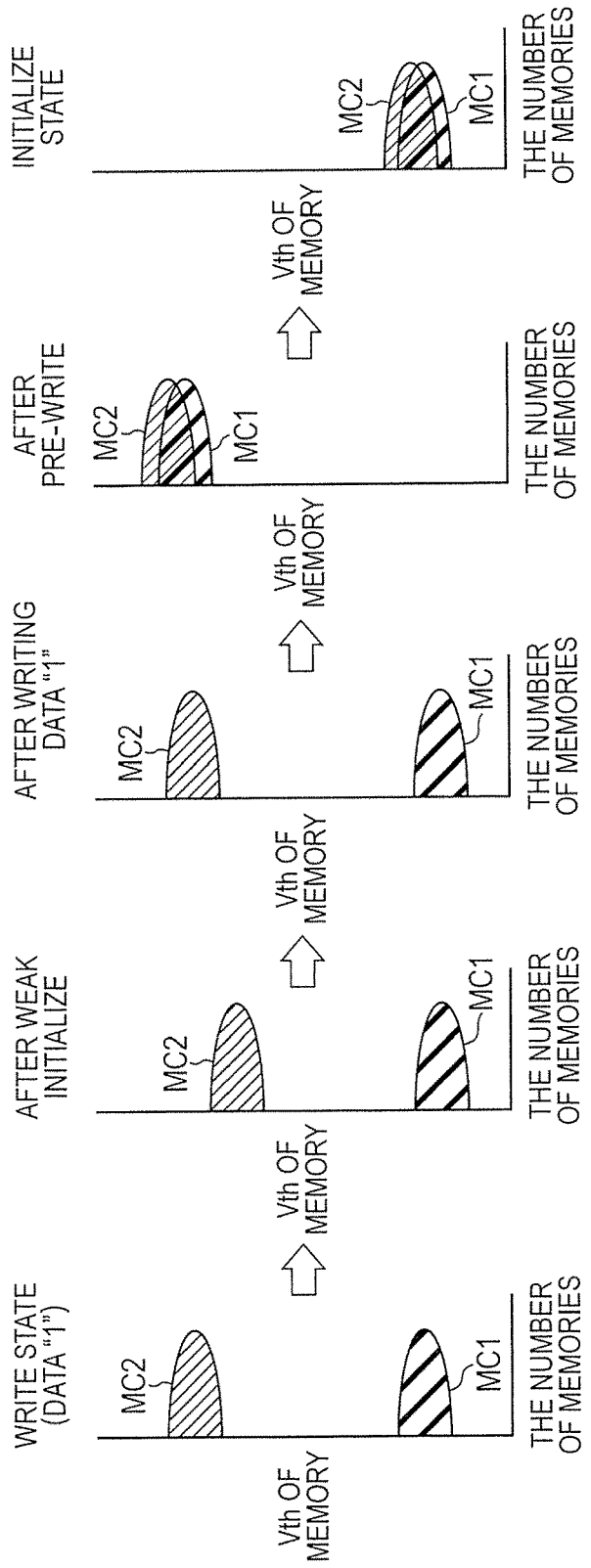
FIG. 14 is a diagram illustrating transition of a threshold voltage distribution of both of memory cells configuring twin cells (data "1") in the case of performing initialization by an initializing method based on the second embodiment.

FIG. 14 is a diagram illustrating transition of a threshold voltage distribution of both of memory cells configuring twin cells (data "1") in the case of performing initialization by the initializing method based on the second embodiment.

As illustrated in FIG. 14, when the flash sequencer 7 performs the control of writing data "1" to the twin cells, the memory cell MC1 in the twin cells enters the low-threshold-voltage state, and the memory cell MC2 enters the high-threshold-voltage state.

When the flash sequencer 7 performs the pre-write control after that, the threshold voltage Vth of the memory cell MC1 becomes the high-threshold-voltage state, and the threshold voltage Vth of the memory cell MC2 becomes high. As a result of performing the pre-write control, the difference between the threshold voltages Vth of the memory cells before the pre-write control exerts an influence, and the threshold voltage Vth of the memory cell MC2 becomes higher than that of the memory cell MC1. Subsequently, the flash sequencer 7 performs initialize control. As a result of performing the initialize control, the difference between the threshold voltages Vth of the memory cells before the initialization exerts an influence, and the threshold voltage Vth of the memory cell MC2 becomes higher than that of the memory cell MC1.

Therefore, also in the case of performing initialization in a state where data of the twin cells is "0" or "1", the data of the twin cells becomes "1" (the state where the threshold voltage Vth of the memory cell MC2 is higher than that of the memory cell MC1).

Therefore, in the case of executing the initializing method based on the above, whether the data of the twin cells written before the initialization is "0" or "1" cannot be determined.

In the embodiment, by effectively setting the read inhibition flag stored in the security state register 230, the initialization is executed by the erasing method having high security performance. Therefore, data leakage can be prevented.

In the embodiment, the security setting information is copied to the flash sequencer 7 during the resetting operation of the microcomputer 1. However, in the case where the security function can be realized by reading the security setting information in the flash memory 6 each time an operation to be protected is generated, the copying to the security state register 230 may not be performed during the resetting operation.

Third Embodiment

In the above, the method of switching the initialize control on the basis of whether the read inhibition flag is valid or invalid has been described. On the other hand, the initialize control may be switched according to the type of a region to be initialized.

Concretely, the initialize control may be switched between the normal user region 140 and the high-security user region 141 in the user region 221.

It is assumed that address information of the normal user region 140 and the high-security user region 141 is stored in the address assignment register 233.

Concretely, the flash sequencer 7 recognizes the address assignment register 233 in accordance with an address designated by the address designation register 232.

The flash sequencer 7 determines whether the designated address is for the normal user region 140 or the high-security user region 141.

When it is determined that the designated address is for the high-security user region 141, the flash sequencer 7 executes erasure in the high-security initialize mode. On the other hand, when it is determined that the designated address is for the normal user region 140, the flash sequencer 7 executes erasure in the high-speed initialize mode.

By the process, initialization by the erasing method with high security performance is executed for the high-security user region 141.

Therefore, since erasure by the high-security initialization is executed for the high-security user region 141, data leakage is prevented, and high security performance can be assured.

Fourth Embodiment

In the foregoing second and third embodiments, the method of increasing the security performance by switching the erasing method has been described.

In a fourth embodiment, the case of switching the erasing method in accordance with the type of a CPU to be accessed will be described.

Figure 15:
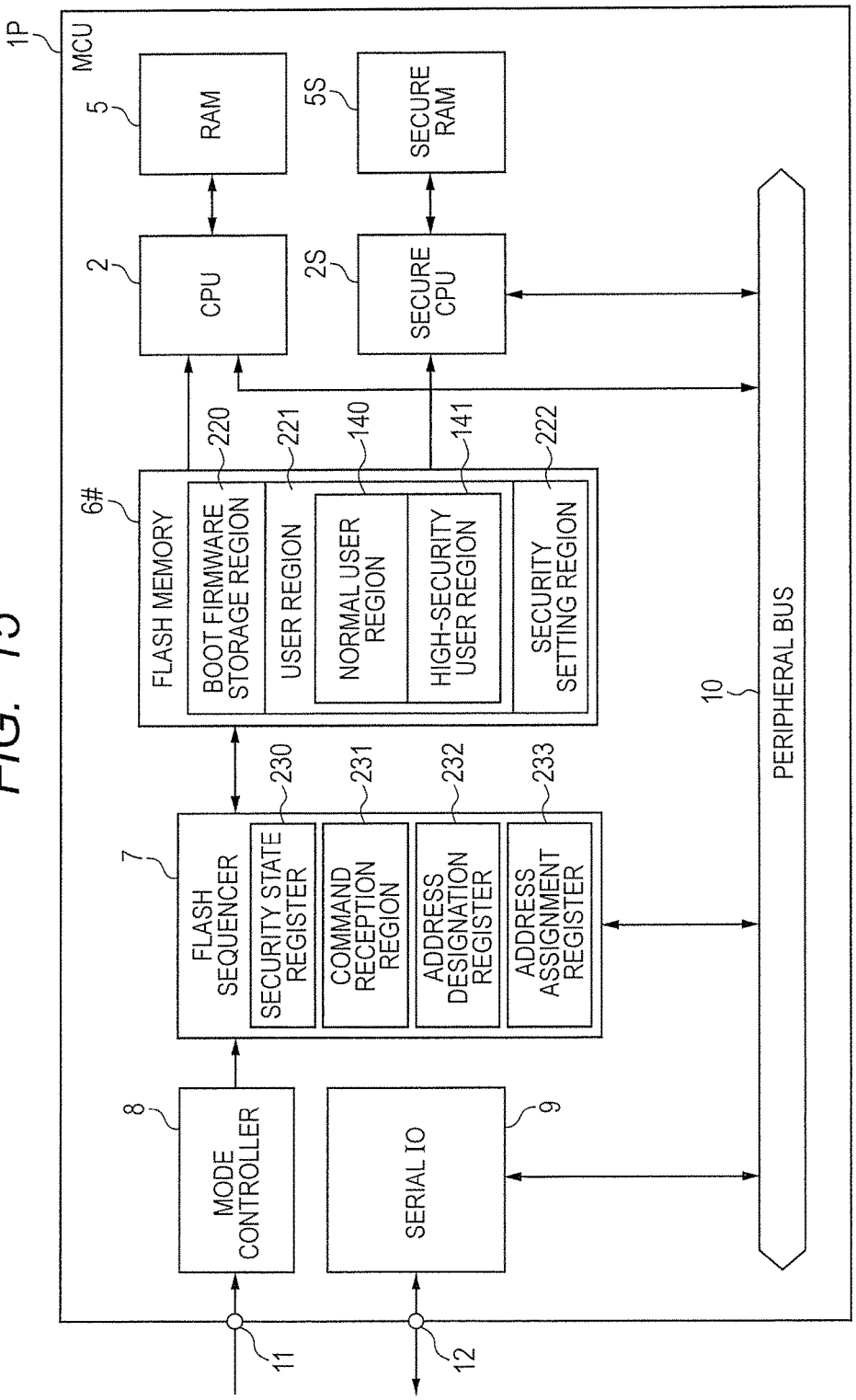
FIG. 15 is a block diagram illustrating the configuration of a semiconductor device based on a fourth embodiment.

FIG. 15 is a block diagram illustrating the configuration of a semiconductor device based on the fourth embodiment.

Referring to FIG. 15, the different points are that the microcomputer 1 is replaced to a microcomputer 1P and the flash memory 6 is replaced to the flash memory 6#.

Other different points are that a CPU 2S and a RAM 5S for secure are provided together with the CPU 2 and the RAM 5 for normal use.

In the embodiment, a software program and data related to security control can be separated for a region dedicated to the secure CPU 2S.

The CPU 2 executes data process by using a software program and data stored in the normal user region 140 and the RAM 5.

The secure CPU 2S executes data process related to security of the microcomputer 1P by using a software program data stored in the high-security user region 141 and the secure RAM 5S.

When a command indicative of erasure is received in the command reception region 231, the flash sequencer 7 identifies a CPU which issued the instruction, and switches the erasing method on the basis of the identification result.

Concretely, in the case of an instruction from the CPU 2, erasure in the high-speed initialize mode is executed. On the other hand, in the case of an instruction from the secure CPU 2S, erasure in the high-security initialize mode is executed.

FIG. 16 is a diagram explaining an erasing method based on the kind of a CPU according to the fourth embodiment.

As illustrated in FIG. 16, when a command indicative of erasure is received in the command reception region 231 from the CPU 2, the flash sequencer 7 executes erasure by the high-speed initialize mode.

When data in the high-security user region 141 is erased by the CPU 2, a problem in security may occur due to an erroneous operation of the secure CPU 2S. Consequently, when erasure to the high-security user region 141 is instructed from the CPU 2, the flash sequencer 7 may stop erasure.

When a command indicative of erasure is received in the command reception region 231 from the secure CPU 2S, the flash sequencer 7 executes erasure by the high-security initialization.

By the process, the erasure by the instruction from the secure CPU 2S prevents data leakage because erasure by the high-security initialization is executed, and high security performance can be assured.

Although the present disclosure has been concretely described on the basis of the embodiments, obviously, the disclosure is not limited to the embodiments and can be variously changed without departing from the gist.

What is claimed is:

1. A semiconductor device comprising:
    a memory region having a plurality of memory cells;
    a read circuit capable of switching between a first reading method, by comparing current flowing in a memory cell to be read of the plurality of memory cells with a reference current, and a second reading method, by comparing currents flowing in first and second memory cells in which complementary data to be read is stored, of the plurality of memory cells;
    a register configured to set a security state;
    a mode controller configured to set a mode; and
    a control circuit configured to switch the read circuit between the first and second reading methods based on the mode set by the mode controller and the security state set by the register.

2. The semiconductor device according to claim 1, wherein the first reading method is a reference current reading method, the second reading method is a complementary reading method.

3. The semiconductor device according to claim 1, wherein the first and the second memory cells are complementary cells.

4. The semiconductor device according to claim 1, wherein the control circuit switches the read circuit between the first and second reading methods based on a first signal corresponding to a boot mode from the mode controller and a second signal corresponding to a read inhibition flag from the register.

5. A semiconductor device comprising:
a memory region having a plurality of complementary cells, each having first and second storing elements holding binary data according to differences in threshold voltages; and
an erasure control circuit configured to initialize the complementary cells,
wherein the memory region includes a normal region, and
wherein, when initializing the normal region, the erasure control circuit is configured to:
change threshold voltages of both the first and second storing elements of the complementary cells in the normal region to be greater than or equal to a first write level, and
change the threshold voltages of both of the first and second storing elements of the complementary cells in the normal region to be less than or equal to the initialization level.

6. The semiconductor device according to claim 5,
wherein the memory region further includes a security region, and
wherein, when initializing the security region, the erasure control circuit is configured to:
change the threshold voltage of the second storing elements of the complementary cells in the security region to an intermediate level lower than the first write level and higher than the initialization level,
change the threshold voltage of the second storing elements of the complementary cells in the security region to be greater than or equal to the first write level,
change threshold voltages of both of the first and second storing elements of the complementary cells in the security region to be greater than or equal to the first write level, and
change threshold voltages of both of the first and second storing elements of the complementary cells in the security region to be less than or equal to the initialization level.

7. The semiconductor device according to claim 6, wherein the erasure control circuit is configured to carry out initialization of the normal region different from that of the security region based on respective addresses of the memory cells in the normal and security regions.

8. The semiconductor device according to claim 5, further comprising:
a register configured to receive data corresponding to a security state,
wherein the data corresponding to the security state is set based on setting information stored in the security region of the memory region.

9. The semiconductor device according to claim 8,
wherein, when the data corresponding to the security state is in a first state, when initializing the security region, the erasure control circuit is configured to:
change the threshold voltage of the second storing elements of the complementary cells in the security region to an intermediate level lower than the first write level and higher than the initialization level,
change the threshold voltage of the second storing elements of the complementary cells in the security region to be greater than or equal to the first write level,
change threshold voltages of both of the first and second storing elements of the complementary cells in the security region to be greater than or equal to the first write level, and
change threshold voltages of both of the first and second storing elements of the complementary cells in the security region to be less than or equal to the initialization level.

10. The semiconductor device according to claim 9,
wherein, when the data corresponding to the security state is in a second state, when initializing the security region, the erasure control circuit is configured to:
change threshold voltages of both the first and second storing elements of the complementary cells in the normal region to be greater than or equal to a first write level, and
change the threshold voltages of both of the first and second storing elements of the complementary cells in the normal region to be less than or equal to the initialization level.

11. A semiconductor device comprising:
a memory region having a plurality of complementary cells, each having first and second storing elements each holding binary data according to differences in threshold voltages; and
an erasure control circuit configured to initialize the complementary cells,
wherein the memory region includes a security region, and
wherein, when initializing the security region, the erasure control circuit is configured to:
change the threshold voltage of the second storing elements of the complementary cells in the security region to an intermediate level which is lower than a first write level and higher than an initialization level,
change the threshold voltage of second storing element of the complementary cells in the security region to be greater than or equal to the first write level,
change threshold voltages of both of the first and second storing elements of the complementary cells in the security region to be greater than or equal to the first write level, and
change threshold voltages of both of the first and second storing elements of the complementary cells in the security region to be less than or equal to the initialization level.

12. The semiconductor device according to claim 11,
wherein the memory region further includes a normal region, and
wherein the erasure control circuit is configured to carry out an initialization of the security region based on addresses of memory cells in the security region.

* * * * *